(12) United States Patent
Takagi et al.

(10) Patent No.: US 8,796,660 B2
(45) Date of Patent: Aug. 5, 2014

(54) NONVOLATILE MEMORY ELEMENT COMPRISING A RESISTANCE VARIABLE ELEMENT AND A DIODE

(75) Inventors: Takeshi Takagi, Kyoto (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 861 days.

(21) Appl. No.: 12/375,881

(22) PCT Filed: Sep. 21, 2007

(86) PCT No.: PCT/JP2007/068392
§ 371 (c)(1),
(2), (4) Date: Jan. 30, 2009

(87) PCT Pub. No.: WO2008/047530
PCT Pub. Date: Apr. 24, 2008

(65) Prior Publication Data
US 2009/0321711 A1    Dec. 31, 2009

(30) Foreign Application Priority Data

Oct. 16, 2006 (JP) ................. 2006-281081

(51) Int. Cl.
| | |
|---|---|
| H01L 29/02 | (2006.01) |
| H01L 47/00 | (2006.01) |
| H01L 29/04 | (2006.01) |
| H01L 29/06 | (2006.01) |
| H01L 29/08 | (2006.01) |
| H01L 31/0352 | (2006.01) |
| H01L 45/00 | (2006.01) |
| H01L 27/24 | (2006.01) |
| H01L 27/10 | (2006.01) |
| H01L 21/00 | (2006.01) |
| G11C 11/00 | (2006.01) |

(52) U.S. Cl.
CPC ............ *H01L 45/04* (2013.01); *H01L 45/1233* (2013.01); *H01L 27/2418* (2013.01); *H01L 45/1683* (2013.01); *H01L 45/146* (2013.01); *H01L 27/2409* (2013.01); *H01L 45/1273* (2013.01); *H01L 27/2463* (2013.01); *H01L 27/101* (2013.01)
USPC .............. 257/4; 257/2; 257/3; 257/5; 257/41; 257/530; 438/95; 365/148; 365/163

(58) Field of Classification Search
USPC ............ 257/2–5, 41, 530, E21.003, E31.029; 438/95; 365/148, 163
See application file for complete search history.

(56) References Cited

U.S. PATENT DOCUMENTS 4,903,087 A * 2/1990 Jerome et al. ................. 257/477
6,114,713 A * 9/2000 Zahorik ........................... 257/4

(Continued)

FOREIGN PATENT DOCUMENTS

| JP | 2004-006777 | 1/2004 |
|---|---|---|
| JP | 2004-319587 | 11/2004 |

(Continued)

*Primary Examiner* — Mamadou Diallo
*Assistant Examiner* — Jay C Chang
(74) *Attorney, Agent, or Firm* — McDermott Will & Emery LLP

(57) ABSTRACT

A nonvolatile memory element (20) of the present invention comprises a resistance variable element (14) and a diode (18) which are formed on a substrate (10) such that the resistance variable element (14) has a resistance variable layer (11) sandwiched between a lower electrode (12) and an upper electrode (13), and the diode (18) which is connected in series with the resistance variable element (14) in the laminating direction and has an insulating layer or semiconductor layer (15) sandwiched between a first electrode (16) at the lower side and a second electrode (17) at the upper side. The resistance variable layer (11) is embedded in a first contact hole (21) formed on the lower electrode (12). A first area (22) where insulating layer or semiconductor layer (15) of the diode (18) is in contact with a first electrode (16) of the diode (18) is larger than at least one of a second area (23) where the resistance variable layer (11) is in contact with the upper electrode (13) and a third area (24) where the resistance variable layer (11) is in contact with the lower electrode (12).

1 Claim, 11 Drawing Sheets

(56) References Cited

U.S. PATENT DOCUMENTS

| | | | |
|---|---|---|---|
| 6,426,891 B1* | 7/2002 | Katori | 365/175 |
| 6,653,195 B1* | 11/2003 | Gonzalez et al. | 438/380 |
| 6,800,563 B2* | 10/2004 | Xu | 438/718 |
| 6,849,868 B2* | 2/2005 | Campbell | 257/35 |
| 7,214,958 B2* | 5/2007 | Happ | 257/4 |
| 7,488,968 B2* | 2/2009 | Lee | 257/4 |
| 7,515,455 B2* | 4/2009 | Nirshl et al. | 365/148 |
| 7,615,770 B2* | 11/2009 | Philipp et al. | 257/2 |
| 2003/0155589 A1* | 8/2003 | Campbell et al. | 257/225 |
| 2004/0202041 A1 | 10/2004 | Hidenori | |
| 2005/0079721 A1* | 4/2005 | Buerger et al. | 438/696 |
| 2005/0167699 A1* | 8/2005 | Sugita et al. | 257/202 |
| 2006/0226409 A1* | 10/2006 | Burr et al. | 257/2 |
| 2006/0249725 A1* | 11/2006 | Lee | 257/4 |
| 2006/0268594 A1 | 11/2006 | Toda | |
| 2007/0010054 A1* | 1/2007 | Fan et al. | 438/257 |
| 2008/0248632 A1* | 10/2008 | Youn et al. | 438/483 |
| 2009/0137112 A1* | 5/2009 | Tabata et al. | 438/631 |
| 2009/0179310 A1* | 7/2009 | Dunton et al. | 257/656 |
| 2009/0184305 A1* | 7/2009 | Lee et al. | 257/2 |
| 2009/0184396 A1* | 7/2009 | Kim et al. | 257/536 |
| 2010/0038617 A1* | 2/2010 | Nakajima et al. | 257/2 |
| 2010/0248431 A1* | 9/2010 | Nishitani et al. | 438/128 |

FOREIGN PATENT DOCUMENTS

| | | |
|---|---|---|
| JP | 2004-349691 | 12/2004 |
| JP | 2005-175461 | 6/2005 |
| JP | 2006-514393 | 4/2006 |
| JP | 2007-180473 | 7/2007 |
| WO | WO 2005/041303 A1 | 5/2005 |
| WO | WO 2007/116749 A1 | 10/2007 |

* cited by examiner (a)

(b)

(a)

(b)

(c)

(d)

(a)

(b)

(a)

(b)

(a)

(b)

NONVOLATILE MEMORY ELEMENT COMPRISING A RESISTANCE VARIABLE ELEMENT AND A DIODE

RELATED APPLICATIONS

This application is the U.S. National Phase under 35 U.S.C. §371 of International Application No. PCT/JP2007/068392, filed on Sep. 21, 2007, which in turn claims the benefit of Japanese Application No. 2006-281081, filed on Oct. 16, 2006, the disclosures of which Applications are incorporated by reference herein.

TECHNICAL FIELD

The present invention relates to a nonvolatile memory element which is suitably adapted for miniaturization and an increase in a speed, and a manufacturing method thereof.

BACKGROUND ART

In recent years, with the advancement of digital technologies, higher functionality of electronic hardware such as portable information devices and information appliances have been provided. With the progress of the higher functionality of the electronic hardware, miniaturization and an increase in a speed of semiconductor elements for use with them have been making rapid progress. Among them, applications of a nonvolatile memory element using a ferroelectric capacitor film or the like which is capable of writing and reading at a high speed with low electric consumption, as a material for a memory portion, have spread at a rapid pace.

Furthermore, since the nonvolatile memory element using a resistance variable layer as a material for a memory portion can constitute a memory element only by using a resistance variable element, further miniaturization, an increase in a speed, and lower electric power consumption of the nonvolatile memory element have been expected.

When using the resistance variable layer as the material for the memory portion, it is required that its resistance value vary from a high-resistance value to a low-resistance value or from the low-resistance value to the high-resistance value by applying electric pulses such that these two values are clearly distinguished and the resistance value stably varies.

To achieve such a stable resistance switching operation, there has been disclosed a structure of non-symmetric memory cells for securing sufficient resistance state switching using a memory resistance material such as a CMR (colossal magnetro-resistance) material, and a manufacturing method thereof (see Patent document 1, 2 for example). The non-symmetric memory cell is formed by a step for forming a lower electrode having a first area, a step for forming an electrical pulse variable resistance (EPVR) material on the lower electrode, and a step for forming an upper electrode on the EPVR layer so as to have a second area smaller than the first area. In such a non-symmetric electrode configuration in which the electrodes are different in size, only an EPVR material located adjacent the upper electrode having the smaller area than the lower electrode increases in a current density and enables resistance switching to occur, by suitably selecting a magnitude of a current flowing in the non-symmetric memory cell. In this manner, because of the non-symmetric configuration of the electrodes, the non-symmetric memory cell can continue to vary the resistance stably, by externally applying a voltage or a current.

There is also disclosed a structure in which a memory element and a control element are formed to extend in a horizontal direction and the memory element has a cross-sectional area smaller than that of the control element so that the memory element can change a state at an energy level lower than that of the control element (e.g., Patent document 3). Such a configuration is intended to attain a memory structure which is economical and has a larger capacity.

Patent document 1: Japanese Laid-Open Patent Application Publication No. 2004-349691
Patent document 2: Japanese Laid-Open Patent Application Publication No. 2005-175461
Patent document 3: Japanese Laid-Open Patent Application Publication No. 2004-6777

DISCLOSURE OF THE INVENTION

Problems to be Solved by the Invention

In the examples disclosed in Patent documents 1 and 2, it is presumed that a problem associated with crosstalk occurs between adjacent lower electrodes and between adjacent upper electrodes in the EPVR layer with the progress of miniaturization. In addition, these examples do not specifically describe a method of applying a driving voltage for varying the resistance of the resistance variable element, for cases including miniaturized configuration.

The example disclosed in Patent document 3 describes that the control element having the larger cross-sectional area than the resistance variable element drives the resistance variable element, as the method for applying a driving voltage for varying the resistance of the resistance variable element, but fails to describe a structure of the memory element having affinity with a process adapted for miniaturization which is mainly based on a process rule that is less than 100 nm.

Also, in a case where the resistance variable element is connected in series with a diode, an amount of a current that is capable of being driven by the diode is small. As a result, the diode is sometimes incapable of supplying a desired and sufficient current to the resistance variable element.

Accordingly, to solve the above problems, there is a need for a nonvolatile memory element having a configuration which has compatibility with a process adapted for miniaturization at present and in the future, is suitably adapted for a mass-production process, and is provided in an appropriate position with a diode capable of supplying a desired and sufficient current to a miniaturized resistance variable element.

In view of the above, an object of the present invention is to provide a configuration of a nonvolatile memory element in which a miniaturized resistance variable element having a structure having compatibility with a mass production process and a diode for supplying a desired and sufficient current to the resistance variable element are connected to each other in an optimal manner, and a manufacturing method thereof.

Means for Solving the Problems

In order to achieve the above described objective, a nonvolatile memory element of the present invention comprises a substrate; an interlayer insulating layer provided on the substrate; a resistance variable element having a lower electrode covered with the interlayer insulating layer, an upper electrode provided to be located farther from the substrate than the lower electrode, and a resistance variable layer interposed between the upper electrode and the lower electrode; and a diode having a first electrode which is provided to be located farther from the substrate than the upper electrode and is connected in series with the upper electrode, a second electrode which is provided to be located farther from the substrate than the first electrode, and an insulating layer or semiconductor layer which is interposed between the first electrode and the second electrode; wherein the interlayer insulating layer is provided with a contact hole penetrating through the interlayer insulating layer in a direction substantially perpendicular to a main surface of the substrate and reaching the lower electrode; the resistance variable layer is embedded in the contact hole; and wherein when an area of a portion where the insulating layer or semiconductor layer is in contact with the first electrode is a first area, an area of a portion where the resistance variable layer is in contact with the upper electrode is a second area, and an area of a portion where the resistance variable layer is in contact with the lower electrode is a third area, the first area is larger than at least one of the second area and the third area.

In accordance with such a configuration, the nonvolatile memory element is manufactured in a semiconductor process adapted for miniaturization as in wiring steps used in a CMOS process, etc, and therefore, it is not necessary to perform a special semiconductor process unique to the resistance variable layer for manufacturing the resistance variable element. Therefore, the nonvolatile memory element has high compatibility with a semiconductor process which is being adapted for further miniaturization, and the resistance variable layer having a minimum size of a process rule in a process to be used can be manufactured. As a result, the nonvolatile memory element can be manufactured in a mass production process that has compatibility with a process adapted for miniaturization which is mainly based on a process rule that is less than 100 nm.

In addition, since adjacent resistance variable elements are isolated by the interlayer insulating layer and a desired and sufficient current can be applied from the diode connected in series with the resistance variable element in the direction in which the constituents are laminated, the nonvolatile memory element is able to repeat resistance switching stably without occurrence of crosstalk.

In the nonvolatile memory element, the first area may be larger than the second area, the first area may be larger than the third area, or the second area may be larger than the third area.

In the nonvolatile memory element, the resistance variable layer may be configured to have a tapered shape having a size decreasing toward the lower electrode.

In accordance with such a configuration, a current density at the interface between the resistance variable layer and the lower electrode increases, enabling the resistance state switching to occur more easily. In addition, by increasing the distance between adjacent lower electrodes, the crosstalk is prevented more surely. Further, since the applied current is caused to converge at the upper electrode efficiently to increase the current density, the resistance switching of the resistance variable element is attained more surely.

In the nonvolatile memory element, the contact hole may be configured to have a tapered shape having a size decreasing toward the lower electrode.

In accordance with such a configuration, since the contact hole has the tapered shape, the area of the interface between the resistance variable layer and the lower electrode can be made smaller more easily. Since the current density at the interface between the resistance variable layer and the lower electrode increases, the resistance state switching occurs more easily.

In the nonvolatile memory element, at least a part of the upper electrode may be embedded in the contact hole, or a part of the upper electrode may be embedded in a convex shape at a center portion of the resistance variable layer.

In accordance with such a configuration, the resistance variable elements can be integrated more compactly, and a close contact state between the resistance variable layer and the upper electrode can be further improved.

In the nonvolatile memory element, the upper electrode and the first electrode may be embedded in the contact hole.

In accordance with such a configuration, since the upper electrode and the first electrode are embedded in the contact hole, the isolation of the diode is achieved. As a result, the isolated diodes can be integrated without additional complicated steps. In this case, so long as the upper electrode and the first electrode are embedded in the contact hole and isolated even though the insulating layer or semiconductor layer is not isolated, the nonvolatile memory element is able to operate as in the isolated configuration in which the insulating layer or semiconductor layer is electrically isolated.

In the nonvolatile memory element, the upper electrode and the first electrode may be a single common electrode, and the common electrode may be configured to have a tapered shape having a size decreasing toward the resistance variable layer.

In accordance with such a configuration, the nonvolatile memory element integrated more compactly is attainable.

In the nonvolatile memory element, the diode may be an MIM (Metal-Insulator-Metal) diode, an MSM (Metal-Semiconductor-Metal) diode, or a shottky diode.

In accordance with such a configuration, a desired and sufficient current can be applied to the resistance variable element.

In the nonvolatile memory element, when a surface where the insulating layer or semiconductor layer is in contact with the first electrode is a first contact surface, the first contact surface may be a concave surface, a convex surface or a concave-convex surface.

In accordance with such a configuration, since the first contact surface can be formed in a three-dimensional form in a specified region above the resistance variable layer, the first area can be made larger. Since the effective area of the diode can be made larger in the specified region, a current drivability of the diode can be further improved.

In the nonvolatile memory element, when a surface where the resistance variable layer is in contact with the upper electrode is a second contact surface, the second contact surface may be a concave surface, a convex surface or a concave-convex surface.

In accordance with such a configuration, a close contact state between the resistance variable layer and the upper electrode can be further improved.

A nonvolatile memory element array of the present invention is a nonvolatile memory element array comprising a plurality of nonvolatile memory elements each of which is described above, wherein a plurality of lower electrodes may be arranged to extend in parallel with each other within a first plane parallel to a main surface of the substrate; wherein a plurality of second electrodes may be arranged to extend in parallel with each other within a second plane parallel to the first plane and to three-dimensionally cross the plurality of lower electrodes; and wherein resistance variable layers may be provided between the plurality of lower electrodes and the plurality of second electrodes to respectively correspond to three-dimensional cross points between the lower electrodes and the second electrodes to form nonvolatile memory elements each of which is as described above and which are provided to respectively correspond to the three-dimensional cross points.

In accordance with such a configuration, a cross-point type nonvolatile memory element which is integrated with high density and is highly practical can be manufactured in a mass production process which has compatibility with the process adapted for miniaturization which is mainly based on the process rule that is less than 100 nm as described above. In addition, since adjacent resistance variable elements are isolated by the interlayer insulating layer and a desired and sufficient current can be applied from the diode positioned adjacent at the upper side, the nonvolatile memory element is able to repeat resistance switching stably without occurrence of crosstalk.

A method of manufacturing a nonvolatile memory element of the present invention comprises a lower electrode forming step for forming a lower electrode on a substrate; a resistance film forming step for forming a resistance variable layer on the lower electrode; an upper electrode forming step for forming an upper electrode on the resistance variable layer; a first electrode forming step for forming a first electrode on the upper electrode; an insulating layer or semiconductor layer forming step for forming an insulating layer or semiconductor layer on the first electrode; and a second electrode forming step for forming a second electrode on the insulating layer or semiconductor layer; wherein the resistance film forming step includes: a step for forming an interlayer insulating layer covering the lower electrode; a hole forming step for forming a contact hole penetrating through the interlayer insulating layer on the lower electrode; and an embedding step for embedding the resistance variable layer in the contact hole; when an area of a portion where the insulating layer or semiconductor layer is in contact with the electrode is a first area, an area of a portion where the resistance variable layer is in contact with the upper electrode is a second area, and an area of a portion where the resistance variable layer is in contact with the lower electrode is a third area, the first area is larger than at least one of the second area and the third area.

In accordance with such a configuration, the resistance variable element and the nonvolatile memory element can be manufactured based on a process rule which is the same as that of a mass production process which has compatibility with the process adapted for miniaturization which is mainly based on the process rule that is less than 100 nm as described above. In addition, since adjacent resistance variable elements are isolated by the interlayer insulating layer and a desired and sufficient current can be applied from the diode positioned adjacent at the upper side, it is possible to manufacture elements which are capable of repeating resistance switching stably without occurrence of crosstalk.

A method of manufacturing a nonvolatile memory element array of the present invention is a method of manufacturing a cross-point type nonvolatile memory element array of the present invention using the above described method of manufacturing the nonvolatile memory element, wherein the lower electrode forming step is a step for forming the plurality of lower electrodes such that the lower electrodes extend in parallel with each other within a first plane parallel to a main surface of the substrate, and the second electrode forming step is a step for forming the plurality of second electrodes such that the second electrodes extend in parallel with each other within a second plane parallel to the first plane and three-dimensionally cross the plurality of lower electrodes.

In accordance with such a configuration, a cross-point type nonvolatile memory element which is integrated with high density and is highly practical can be manufactured based on the process rule which is the same as that of the mass production process which has compatibility with the process adapted for miniaturization which is mainly based on the process rule that is less than 100 nm as described above. In addition, since adjacent resistance variable elements are isolated by the interlayer insulating layer and a desired and sufficient current can be applied from the diode positioned adjacent at the upper side, it is possible to manufacture the element which is capable of repeating resistance switching stably without occurrence of crosstalk.

In the method of manufacturing the nonvolatile memory element, in the hole forming step, the contact hole may be formed to have a tapered shape having a size decreasing toward the lower electrode.

In accordance with such a configuration, the nonvolatile memory element is manufactured such that the distance between adjacent lower electrodes can be increased, thereby preventing the crosstalk more surely. Further, since the applied current is caused to converge efficiently to increase the current density, the nonvolatile memory element is manufactured so that the resistance switching occurs more surely.

The above and further objects, features and advantages of the present invention will more fully be apparent from the following detailed description of preferred embodiments with accompanying drawings.

Effects of the Invention

In the nonvolatile memory element of the present invention, the resistance variable element and the diode are connected in series in the laminating direction, and the resistance variable layer forming the resistance variable element is embedded in the first contact hole formed to penetrate through the first interlayer insulating layer on the lower electrode. Furthermore, the first area of a portion in contact with the first electrode of the diode is made larger than the second area where the resistance variable layer is in contact with the upper electrode.

In accordance with such a configuration, the nonvolatile memory element is manufactured in a semiconductor process adapted for miniaturization as in wiring steps used in a CMOS process, etc, and therefore, it is not necessary to perform a special semiconductor process unique to the resistance variable layer for manufacturing the resistance variable element. Therefore, the nonvolatile memory element has high compatibility with a semiconductor process which is being adapted for further miniaturization, and the resistance variable layer having a minimum size of a process rule in a process to be used can be manufactured. As a result, the nonvolatile memory element of the present invention can be manufactured in a mass production process that has compatibility with a process adapted for miniaturization which is mainly based on a process rule that is less than 100 nm. In addition, since adjacent resistance variable elements are isolated by the interlayer insulating layer and a desired and sufficient current can be applied from the diode located at the upper side, the nonvolatile memory element of the present invention is able to repeat resistance switching stably without occurrence of crosstalk.

In the nonvolatile memory element of the present invention, since the first area is made larger than the second area, the diode which has a relatively large size providing a high current drivability and the resistance variable element miniaturized up to the process rule are connected to each other in an optimal manner.

In the cross-point type nonvolatile memory element, since electric isolation is attained so that crosstalk between resistance variable elements including resistance variable layers which are located adjacent to each other two-dimensionally can be suppressed, the advantages similar to those described above can be achieved.

By using the nonvolatile memory element of the present invention, it is possible to achieve an advantage that electronic hardware such as portable information devices and information appliances can be further reduced in size and made thinner.

BRIEF DESCRIPTION OF THE DRAWINGS

FIG. 1 is a view showing a nonvolatile memory element according to Embodiment 1 of the present invention, wherein FIG. 1(a) is a schematic cross-sectional view of the nonvolatile memory element and FIG. 1(b) is a schematic cross-sectional view of a modification of the nonvolatile memory element formed by simplifying the configuration of FIG. 1(a).

FIG. 3 is a schematic cross-sectional view of the nonvolatile memory element array of FIG. 2, wherein FIG. 3(a) is a schematic cross-sectional view taken in the direction of arrows along line A-A and FIG. 3(b) is a schematic cross-sectional view taken in the direction of arrows along line C-C.

FIG. 6 is a schematic cross-sectional view of a nonvolatile memory element according to Embodiment 2 of the present invention, wherein FIG. 6(a) is a schematic cross-sectional view of the nonvolatile memory element in which an upper electrode has a cross-section of a tapered shape and FIG. 6(b) is a schematic cross-sectional view of the nonvolatile memory element in which a part of the upper electrode is embedded in an upper portion of a first contact hole.

FIG. 7 is a schematic cross-sectional view of a nonvolatile memory element according to Embodiment 3 of the present invention, wherein FIG. 7(a) is a schematic cross sectional view showing the state where the resistance variable layer and the upper electrode are embedded in the first contact hole of the tapered shape, and FIG. 7(b) is a schematic cross-sectional view as viewed from the direction of D in FIG. 7(a).

FIG. 8 is a schematic cross-sectional view of a nonvolatile memory element according to Embodiment 4 of the present invention, wherein FIG. 8(a) is a schematic cross-sectional view of the nonvolatile memory element in which a convex portion is provided at a center of an upper portion of the upper electrode and FIG. 8(b) is a schematic cross-sectional view of the nonvolatile memory element in which a concave-convex surface is provided on the upper surface of the upper electrode.

FIG. 9 is a schematic cross-sectional view of a nonvolatile memory element according to Embodiment 5 of the present invention, wherein FIG. 9(a) is a schematic cross-sectional view of the nonvolatile memory element in which a concave portion is provided at a center of an upper portion of the resistance variable layer and FIG. 9(b) is a schematic cross-sectional view of the nonvolatile memory element in which the concave-convex surface is provided on the upper surface of the resistance variable layer.

Figure 1:
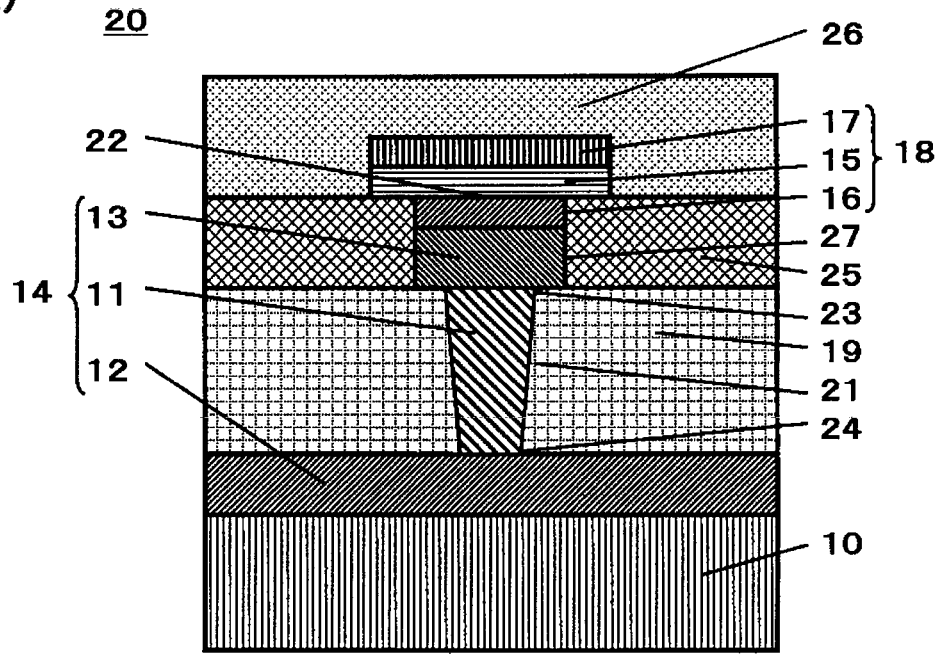
Figure 1:
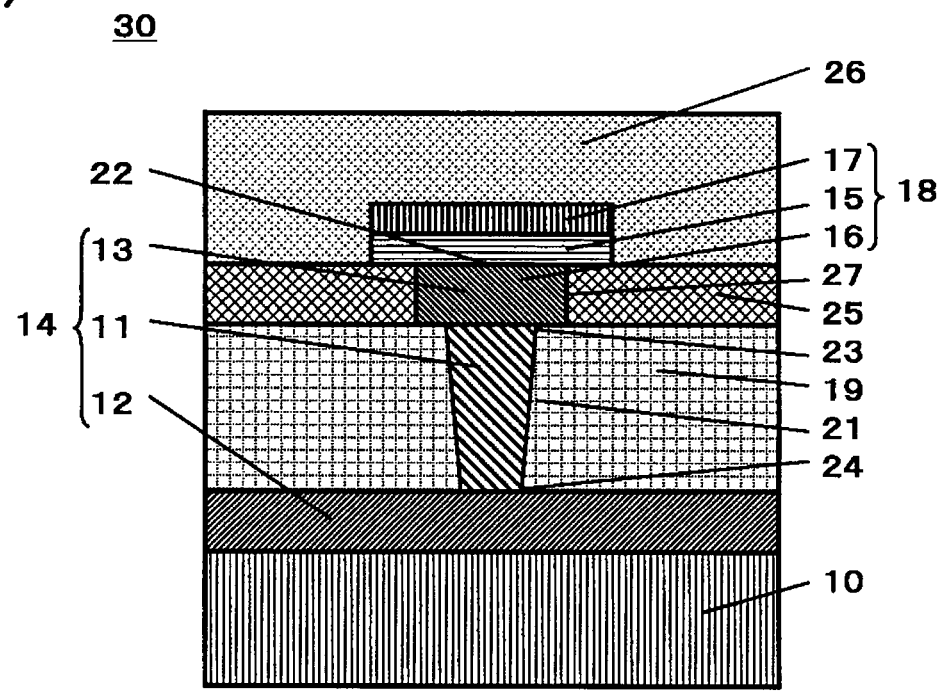

EXPLANATION OF REFERENCE NUMERALS 10 substrate
11, 52, 61 resistance variable layer
12, 12a, 12b, 12c, 12d, 12e, 12f, 12g, 12h lower electrode
13, 53, 63 upper electrode
14 resistance variable element
15 insulating layer (semiconductor layer)
16 first electrode
17, 17a, 17b, 17c, 17d, 17e, 17f, 17g, 17h second electrode
18 diode
19 first interlayer insulating layer
20, 30, 45, 50, 55, 60, 65, 70, 75 nonvolatile memory element
40 nonvolatile memory element array,
21, 51 first contact hole
22 first area
23 second area
24 third area
25 second interlayer insulating layer
26 third interlayer insulating layer
27, 42 second contact hole
41 substrate surface
54 convex portion
56, 62 concave portion
57, 59, 66 concave-convex surface
58 first contact surface
64 second contact surface

BEST MODE FOR CARRYING OUT THE INVENTION

Hereinafter, preferred embodiments of the present invention will be described with reference to the drawings. The components or constituents identified by the same reference numerals throughout the drawings will not be described in some cases.

Embodiment 1

FIGS. 1 to 5 are views showing Embodiment 1 of the present invention. FIG. 1(a) is a schematic cross-sectional view of a nonvolatile memory element 20 of this embodiment and FIG. 1(b) is a schematic cross-sectional view of a nonvolatile memory element 30 according to a modification which is formed by simplifying the configuration of the nonvolatile memory element 20.

As shown in FIG. 1(a), the nonvolatile memory element 20 is configured to include a resistance variable element 14 and a diode 18 which are formed on a substrate 10 such that the resistance variable element 14 has a resistance variable layer 11 sandwiched between a lower electrode 12 and an upper electrode 13, and the diode 18 is connected in series with the resistance variable element 14 in a direction in which constituents are laminated and has an insulating layer or semiconductor layer 15 (the term "insulating layer or semiconductor layer 15" refers to a layer made of an insulator or a semiconductor and may be named a diode layer) sandwiched between a first electrode 16 at the lower side and a second electrode 17 at the upper side. The resistance variable layer 11 is embedded in a first contact hole 21 formed on the lower electrode 12 to penetrate through a first interlayer insulating layer 19 covering the lower electrode 12. A first area 22 where the insulating layer or semiconductor layer 15 of the diode 18 is contact with the first electrode 16 of the diode 18 is set larger than a second area 23 where the resistance variable layer 11 is in contact with the upper electrode 13.

The nonvolatile memory element 30 shown in FIG. 1(b) has a configuration formed by simplifying the configuration of the nonvolatile memory element 20 shown in FIG. 1(a), in which the upper electrode 13 of the resistance variable element 14 and the first electrode 16 of the diode 18 are a common electrode. In other words, in the configuration of FIG. 1(b), the upper electrode 13 of the resistance variable layer 14 also serves as the first electrode 16 of the diode 18.

As shown in FIG. 1(a) and FIG. 1(b), the second area 23 where the resistance variable layer 11 is in contact with the upper electrode 13 is set larger than a third area 24 where the resistance variable layer 11 is in contact with the lower electrode 12.

Which of the second area 23 and the third area 24 should be larger is not particularly limited. Setting the first area 22 to be larger than at least either the second area 23 or the third area 24 will suffice. That is, setting the first area 22 to be larger than the smaller one of the second area 23 and the third area 24 will suffice. In view of steps such as etching described later, making the third area 24 smaller in the step for forming a contact hole will be efficient. Therefore, the third area 24 is desirably smaller than the second area 23.

In such a configuration, an electrode area on the diode side is larger, and hence the electrode of the diode is larger than the lower electrode of the resistance variable layer, resulting in a high drivability for the resistance variable element.

In addition, since the applied current is caused to converge efficiently to increase a current density, the nonvolatile memory element is manufactured so that the resistance switching occurs more surely.

It is presumed that such an effect is related to an operation mechanism of the resistance variable element. To be specific, it is becoming clear that resistance state switching occurs at the interfaces between the electrodes and the resistance variable layer in the resistance variable element. According to this finding, generation of a sufficiently high current density or voltage at the interfaces between the electrodes and the resistance variable layer can effectively vary the resistance state surely. Decreasing the area of the interfaces can effectively cause the generation of the high current density or voltage. Since in both of the interfaces, a total amount of the current is equal, the current density or voltage is higher and hence the resistance state easily varies at the interface corresponding to the smaller one of the second area 23 and the third area 24. Therefore, whether or not the resistance state of the resistance variable element varies is determined by the current density or voltage generated at the interface having a smaller area, of the interfaces between the resistance variable layer and the upper and lower electrodes. The resistance state varies more easily at the interface having a smaller area. On the other hand, the current drivability of the diode is roughly proportional to the electrode area of the diode. By setting the electrode area (area of the interface between the electrode and the resistance variable layer) of the resistance variable element to be smaller than the electrode area of the diode, the resistance state of the resistance variable element can be varied more surely while maintaining a current drivability of the diode at a high level.

In the nonvolatile memory elements 20 and 30 having the above configuration, the resistance variable element 14 and the diode 18 are formed on the substrate 10, and their side and upper portions are covered with the first interlayer insulating layer 19, a second interlayer insulating layer 25 and a third interlayer insulating layer 26.

In the configuration of FIGS. 1(a) and 1(b), the upper electrode 13 is embedded in a second contact hole 27 penetrating through the second interlayer insulating layer 25, so that isolation of the diode 18 is attained when the resistance variable element 14 and the diode 18 are positioned adjacent.

In such a configuration, the nonvolatile memory element 20 is capable of isolation of the diode 18, and of high-dense integration of the isolated diodes 18 without additional complicated steps. In this case, so long as the upper electrode 13 is embedded in the second contact hole 27 and isolated even though the insulating layer or semiconductor layer 15 is not isolated, the nonvolatile memory element 20 is able to operate, as in the isolated configuration in which the insulating layer or semiconductor layer 15 is electrically isolated. The nonvolatile memory element 20 is manufactured in a semiconductor process adapted for miniaturization as in wiring steps used in a CMOS process, etc, and therefore, it is not necessary to perform a special semiconductor process unique to the resistance variable layer for manufacturing the resistance variable element. Therefore, the nonvolatile memory element 20 has high compatibility with a semiconductor process which is being adapted for further miniaturization, and the resistance variable layer having a minimum size of a process rule in a process to be used can be manufactured. As a result, the nonvolatile memory element 20 can be manufactured in a mass production process that has compatibility with a process adapted for miniaturization which is mainly based on a process rule that is less than 100 nm.

During the operation of the nonvolatile memory element 20, the resistance variable layer 11 of the resistance variable element 14 is applied with an electric pulse from the upper electrode 13 to the lower electrode 12 via the diode 18. According to the electric pulse applied, the resistance variable layer 11 exhibits a characteristic in which its resistance value increases or decreases as a memory portion. Since the second area 23 is larger than the third area 24 and the first area 22 is larger than the second area 23, a current having a value necessary and sufficient to increase or decrease the resistance value can be supplied from the diode 18 at the upper side to the resistance variable layer 11. In addition, adjacent resistance variable elements 14 are isolated from each other by the first interlayer insulating layer 19, resistance switching can repeat stably without occurrence of crosstalk. According to the switching in the resistance value, data is stored or read out.

Thus, with the configuration in which the resistance variable element 14 is connected in series with the diode 18 in the laminating direction, it is possible to rewrite and read out the data with respect to and from the resistance variable element 14 by appropriately utilizing a diode property. To be specific, when the data is rewritten with respect to the resistance variable element 14, a relatively large voltage is applied to the nonvolatile memory element 20 including the diode 14, causing the diode 14 to operate in a low-resistance state. At this time, the diode 14 is in the low-resistance state, and thus a voltage drop of the applied voltage in the diode 14 is less, enabling the resistance variable element 14 to be applied with a voltage efficiently. As a result, the resistance switching can occur stably. On the other hand, when the data is read out from the resistance variable element 14, a relatively small voltage is applied to the nonvolatile memory element 20, causing the diode 14 to operate in a high-resistance state. At this time, a voltage drop of the applied voltage in the diode 14 is large, enabling the resistance variable element 14 to be applied with a voltage having a suitable value stably, and thereby its resistance value can be read out. At this time, even if a noise voltage is added to the applied voltage via an electric power supply line, a large part of it is absorbed in the diode 14. As a result, an incorrect operation that the resistance value in the resistance variable element 14 is rewritten erroneously does not substantially occur.

Figure 2:
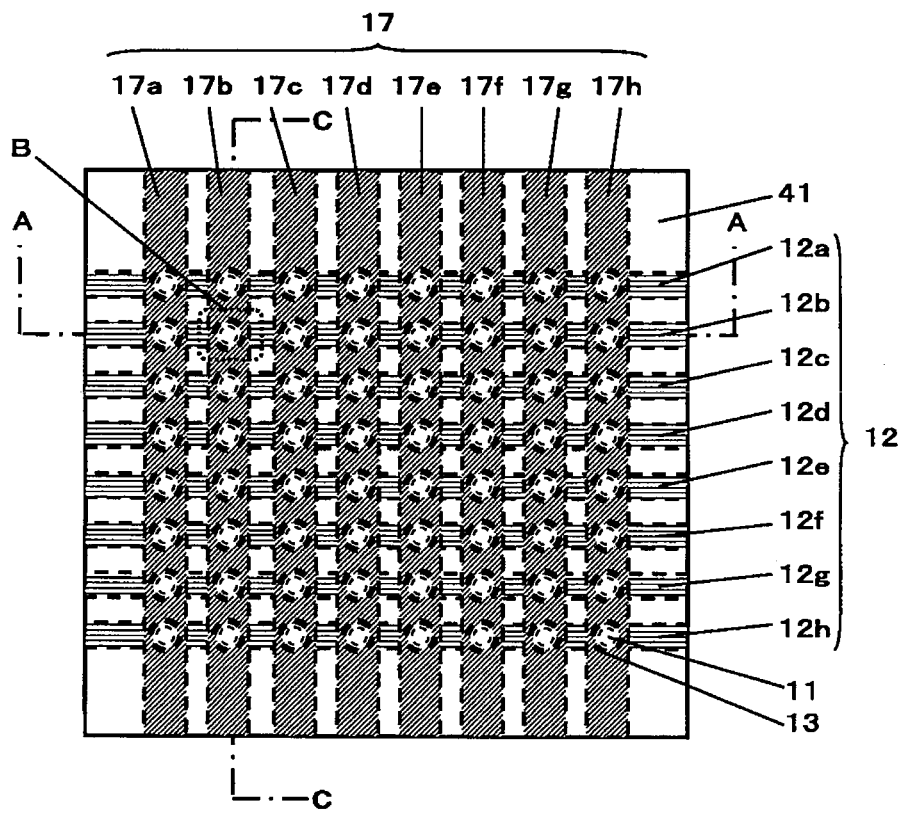
FIG. 2 is a schematic view of a configuration of a cross-point type nonvolatile memory element array according to Embodiment 1 of the present invention, as viewed from a substrate surface.

FIG. 2 is a schematic view showing the configuration of a cross-point type nonvolatile memory element array 40 by using the configuration of the nonvolatile memory element shown in FIG. 1(a) or 1(b), as viewed from a substrate surface 41 of a semiconductor chip. The nonvolatile memory element array 40 in FIG. 2 has a configuration in which on the substrate, the lower electrodes 12 and the stripe-shaped second electrodes 17 crossing the lower electrodes 12 at a right angle sandwich the resistance variable layers ii which serve as the memory portion. Here, for example, eight lower electrodes 12 (12a, 12b, 12c, 12d, 12e, 12f, 12g, and 12h) and eight second electrodes 17 (17a, 17b, 17c, 17d, 17e, 17f, 17g, and 17h) are shown. In each of the crossing regions of these electrodes, the resistance variable layer 11 is sandwiched between the lower electrode 12 and the upper electrode 13 to form the resistance variable element 14. As a whole, a plurality of memory portions are arranged in matrix. In other words, in the nonvolatile memory element array 40, the plurality of lower electrodes 12 are arranged so as to extend in parallel with each other within a first plane parallel to a main surface of the substrate 10, the plurality of second electrodes 17 are arranged so as to extend in parallel with each other within a second plane parallel to the first plane and so as to three-dimensionally cross the plurality of lower electrodes 12, and the resistance variable layers are provided between the plurality of lower electrodes 12 and the plurality of second electrodes so as to respectively correspond to the three-dimensional cross points between the lower electrodes and the second electrodes, thus forming the nonvolatile memory elements 14 respectively corresponding to the three-dimensional cross points.

FIG. 3(a) is a schematic cross-sectional view of the cross-point type nonvolatile memory element array 40 of FIG. 2 based on the basic configuration of the nonvolatile memory element shown in FIG. 1(b), which is taken in the direction of the arrows along line A-A. FIG. 3(b) is a schematic cross-sectional view of the cross-point type nonvolatile memory element array 40 of FIG. 2 based on the basic configuration of the nonvolatile memory element shown in FIG. 1(b), which is taken in the direction of the arrows along line C-C. The configuration in a region surrounded by a broken line B corresponds to the memory cell which is the basic configuration.

FIGS. 3(a) and 3(b) show examples in which eight memory cells are arranged. Each memory cell includes the resistance variable element 14 having the resistance variable layer 11 sandwiched between the lower electrode 12 and the upper electrode 13, and the diode 18 having, for example, an insulating layer sandwiched between the upper electrode 13 (common electrode) also serving as the first electrode and a second electrode 17b. FIGS. 3(a) and 3(b) are schematic cross-sectional views of the nonvolatile memory element array 40 as viewed from the locations perpendicular to each other, showing that the stripe-shaped lower electrodes 12 and the stripe-shaped second electrodes 17 cross each other at a substantially right angle and sandwich the resistance variable layers 11 between them.

In order to enable the diode 18 to supply a desired and sufficient current to the resistance variable element 14, the first area 22 which is a measure for the size of the diode 18 is made larger than the second area 23 which is a measure for the size of the resistance variable element 14. In order to further reduce the cross talk between adjacent memory cells, the third area 24 is made smaller than the second area 23 but may be equal to the second area 23.

In the nonvolatile memory element array 40, since the upper electrode 13 is embedded in the second contact hole 27 in the second interlayer insulating layer 25, the isolation of the diode 18 is achieved. As a result, the isolated diodes 18 can be integrated without additional complicated steps. In this case, so long as the upper electrode 13 is embedded in the second contact hole 27 and isolated even though the insulating layer or semiconductor layer 15 is not isolated between the adjacent memory cells, the nonvolatile memory element array 40 is able to operate as in the isolated configuration in which the insulating layer or semiconductor layer 15 is electrically isolated.

Figure 3:
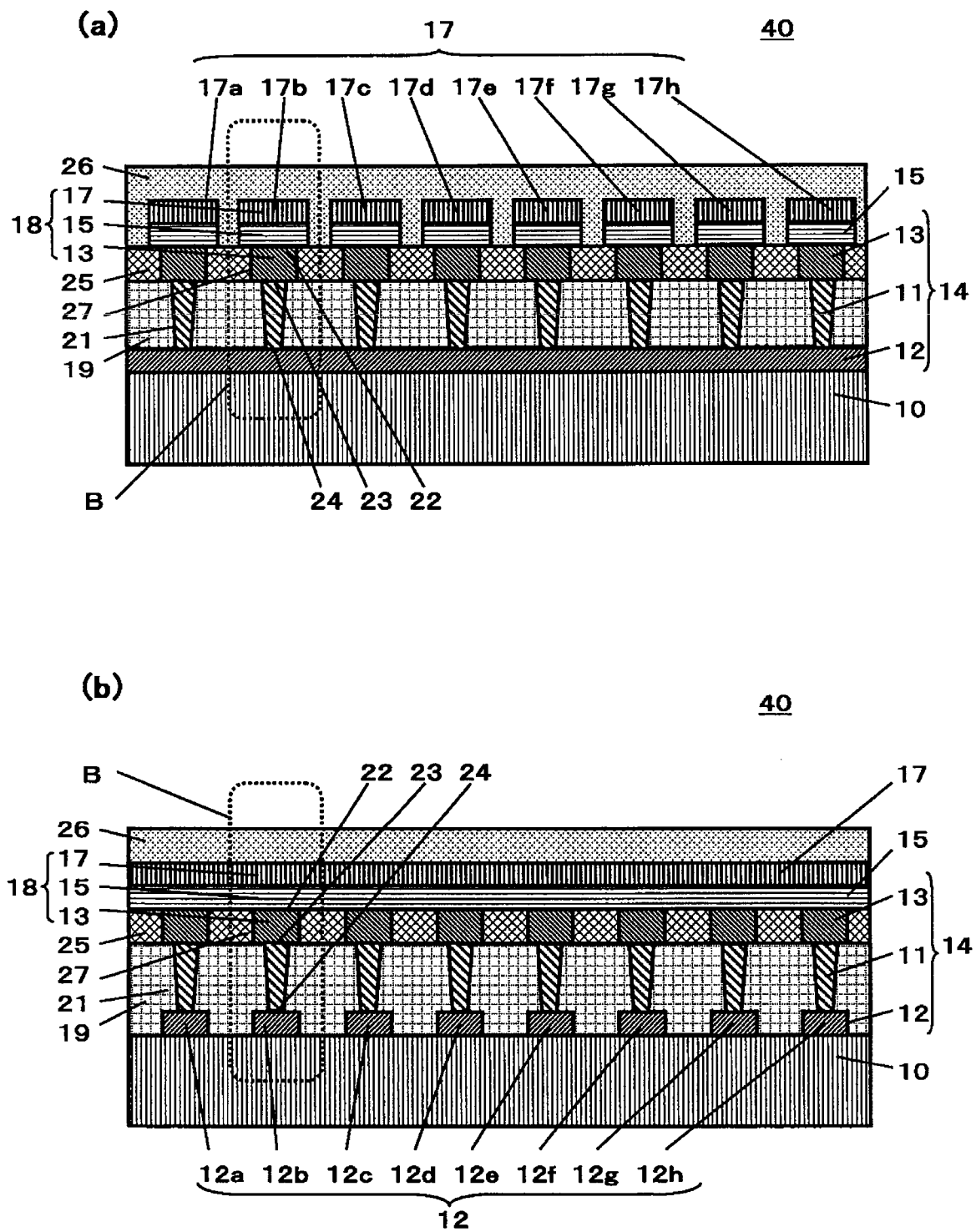

As in the configurations of FIGS. 1(a) and 1(b), in the configuration of FIGS. 2 and 3, the resistance variable layers 11 forming the plurality of memory portions are applied with an electric pulse from the upper electrodes 13 to the lower electrodes 12 via the diodes 18. According to the electric pulse applied the resistance variable layers 11 exhibit a characteristic in which their resistance values increase or decrease as the memory portions. According to the switching in the resistance values, the data is stored or read out.

With the configuration in which the resistance variable layer 14 is connected in series with the diode 18 in the laminating direction, it is possible to rewrite and read out the data with respect to and from the resistance variable element 14 by appropriately utilizing a diode property. To be specific, when the data is rewritten with respect to the resistance variable element 14, a relatively large voltage is applied to the nonvolatile memory element array 40 including the diode 14, causing the diode 14 to operate in a low-resistance state. At this time, the diode 14 is in the low-resistance state, and therefore a voltage drop of the applied voltage in the diode 14 is less, enabling the resistance variable element 14 to be applied with a voltage efficiently. As a result, the resistance switching can occur stably. On the other hand, when the data is read out from the resistance variable element 14, a relatively small voltage is applied to the nonvolatile memory element array 40, causing the diode 14 to operate in a high-resistance state. At this time, a voltage drop of the applied voltage in the diode 14 is large, enabling the resistance variable element 14 to be applied with a voltage having a suitable value stably, so that its resistance value can be read out. At this time, even if a noise voltage is added to the applied voltage via the electric power supply line, a large part of it is absorbed in the diode 14. As a result, an incorrect operation that the resistance value in the resistance variable element 14 is rewritten erroneously does not substantially occur.

Subsequently, as an example of this embodiment, a manufacturing method of the nonvolatile memory element 30 shown in FIG. 1(b) will be described. FIGS. 4(a) to 4(d) and FIG. 5(a) to 5(d) sequentially show a process flow of the nonvolatile memory element 30. To be specific, the manufacturing method of the nonvolatile memory element of this embodiment includes a lower electrode forming step for forming the lower electrode 12 on the substrate 10, a resistance film forming step for forming the resistance variable layer 11 on the lower electrode 12, an upper electrode forming step for forming the upper electrode 13 on the resistance variable layer 11, a step for forming the insulating layer or semiconductor layer 15 on the upper electrode 13, and a second electrode forming step for forming the second electrode 17 on the insulating layer or semiconductor layer 15. It should be noted that although a step for forming the first electrode 16 shown in FIG. 1(*a*) on the upper electrode 13 may be added to this embodiment, the upper electrode 13 and the first electrode 16 are formed as being common in the nonvolatile memory element 30, description for this step is omitted.

The resistance film forming step includes a step for forming the first interlayer insulating layer 19 covering the lower electrode 12, a hole forming step for forming a first contact hole 21 penetrating through the first interlayer insulating layer 19 on the lower electrode 12, and an embedding step for embedding the resistance variable layer 11 in the first contact hole 21. Furthermore, in the manufacturing method of the nonvolatile memory element of this embodiment, the first area 22 where the insulating layer or semiconductor layer 15 is in contact with the upper electrode 13 is made larger than the second area 23 where the resistance variable layer 11 is in contact with the upper electrode 13. The manufacturing method configured as described above will be explained sequentially according to the process flow shown in FIGS. 4 and 5.

Figure 4:
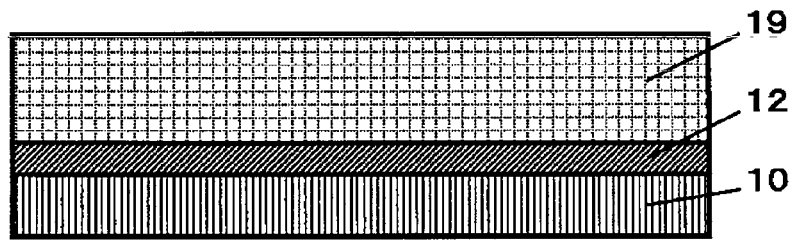
FIGS. 4(a) to 4(d) are step cross-sectional views showing a process flow according to Embodiment 1 of the present invention.
Figure 4:
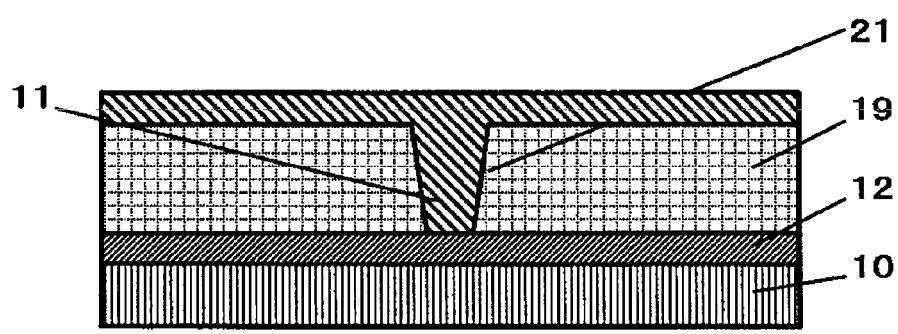
Figure 4:
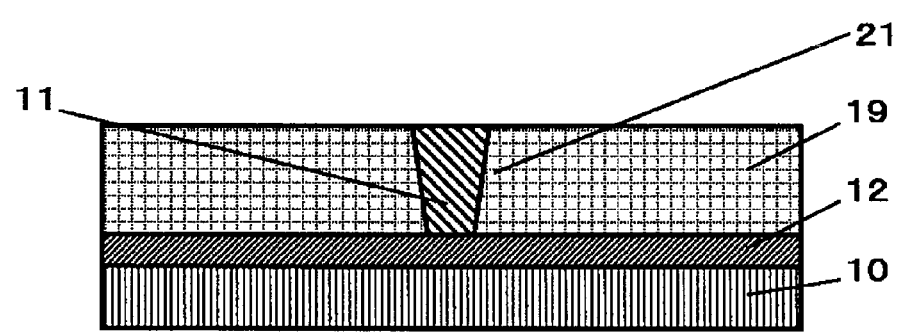
Figure 4:
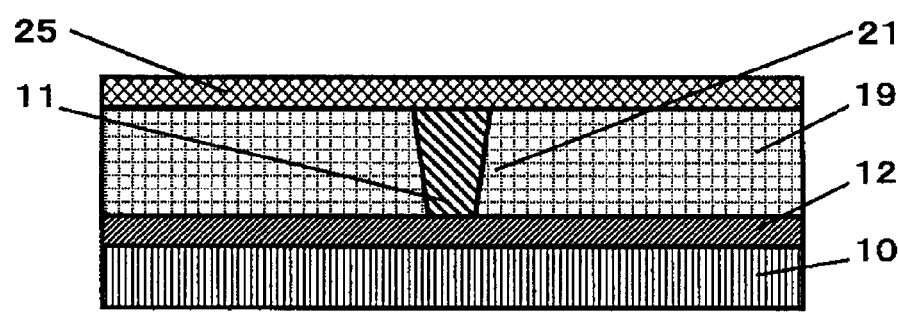

As shown in FIG. 4(*a*), for example, the lower electrode 12 made of Al material is formed on the substrate 10 made of Si material to extend in a predetermined direction having a width of 0.1 µm and a thickness of 0.1 µm by a vapor deposition process and an etching process. In addition, by a CVD process or the like, a fluorine-doped oxide film, which is the first interlayer insulating layer 19, is deposited to have a thickness of 200 nm, covering the substrate 10 and the lower electrode 12.

Then, as shown in FIG. 4(*b*), the first contact hole 21 having a diameter of 80 nm is formed to penetrate through the first interlayer insulating layer 19 on the lower electrode 12, by for example, a dry etching process. A transition metal oxide film material is filled in the first contact hole 21 by a sputtering process, thereby forming the resistance variable layer 11 formed of a resistance variable material made of, for example, $Fe_3O_4$ embedded in the first contact hole 21. This material is also deposited in a layer form on the first interlayer insulating layer 19 as shown in FIG. 4(*b*).

Then, as shown in FIG. 4(*c*), the resistance variable layer 11 deposited on the first interlayer insulating layer 19 is removed using a CMP (chemical machine polishing) technique to expose the surface of the first interlayer insulating layer 19, leaving only a portion of the resistance variable layer 11 deposited in the first contact hole 21. Then, as shown in FIG. 4(*d*), on the resistance variable layer 11 and the first interlayer insulating layer 19 which have been flattened, a fluorine-doped oxide film having a thickness of 0.1 µm is deposited as the second interlayer insulating layer 25, by, for example, the CVD process or the like.

Figure 5:
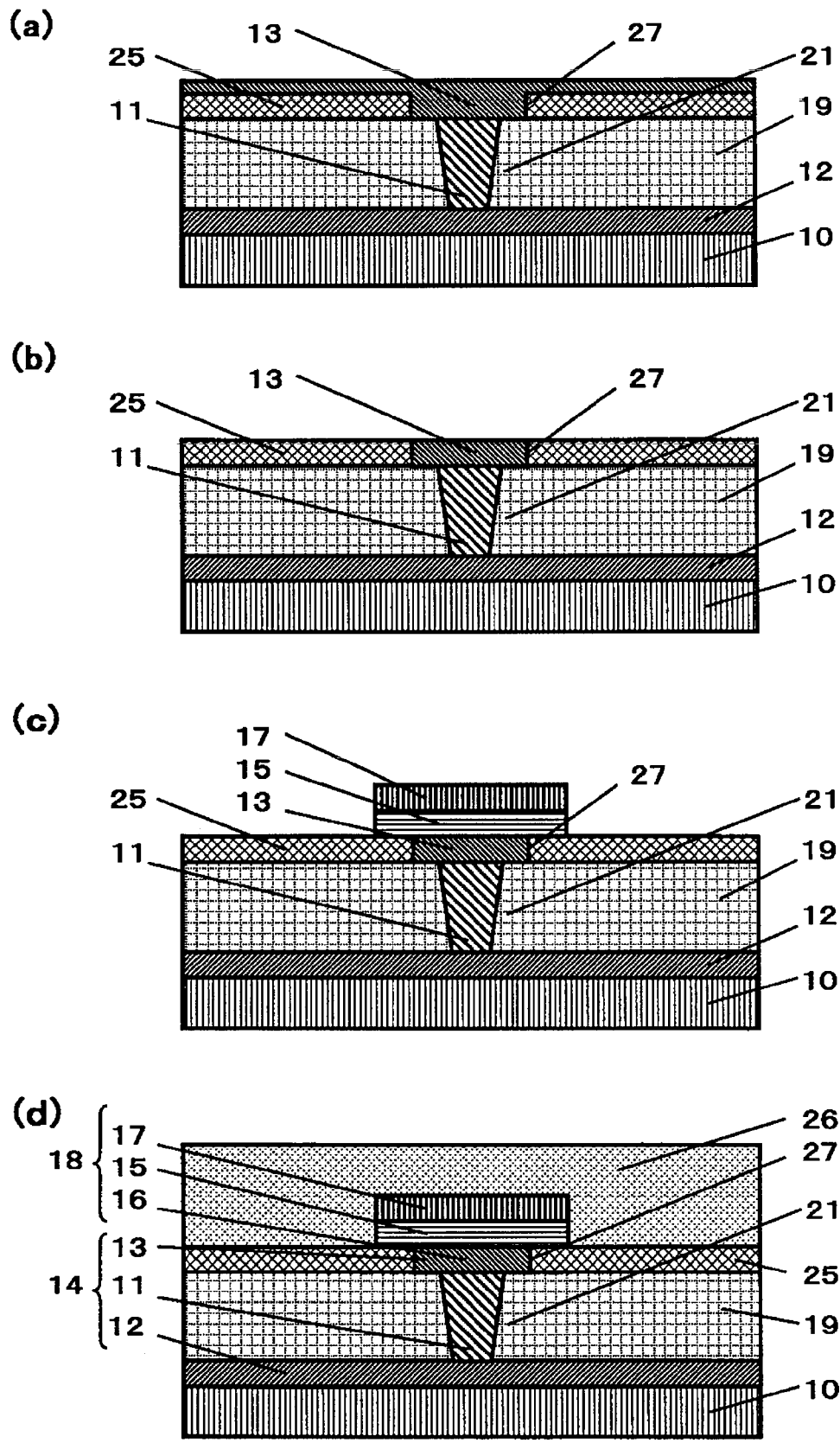
FIGS. 5(a) to 5(d) are step cross-sectional views showing a process flow according to Embodiment 1 of the present invention.

Then, as shown in FIG. 5(*a*), the second contact hole 27 having a diameter of 100 nm is formed to penetrate through the second interlayer insulating layer 25 on the resistance variable layer 11 and the first interlayer insulating layer 19, by for example, a dry etching process. Then, by the sputtering process, for example, Al material is embedded in the second contact hole 27 and formed in a layer form as the material for the upper electrode 13 on the second interlayer insulating layer 25. Then, as shown in FIG. 5(*b*), the electrode material on the second interlayer insulating layer 25 is removed by the CMP technique. Further, on the upper electrode 13 and the second interlayer insulating layer 25, a SiN film having a thickness of 10 nm and a Al material having a thickness of 0.1 µm thickness are formed by, for example, the sputtering process, and then the line-shaped insulating layer 15 formed of the SiN film and having a width of 180 nm and the line-shaped second electrode 17 made of Al material and having a width of 180 nm, are formed to cover the upper electrode 13 as shown in FIG. 5(*c*).

When the structure shown in FIG. 1(*a*) is formed in the above described process, the electrode material on the second interlayer insulating layer 25 is removed by the CMP technique as shown in FIG. 5(*b*), then the electrode material is etched back to a certain depth, and then the lower electrode Al for the diode is embedded by the sputtering, followed by flattening using the CMP again. Furthermore, on the lower electrode (first electrode) 16 of the diode and the second interlayer insulating layer 25, a SiN film having a 10 nm thickness and an Al material having a 0.1 µm thickness are formed by, for example, the sputtering process, and then the line-shaped insulating layer 15 formed of the SiN film and having a width of 180 nm and the line-shaped second electrode 17 made of Al material and having a width of 180 nm, are formed to cover the lower electrode 16 of the diode.

Furthermore, as shown in FIG. 5(*d*), the third interlayer insulating layer 26 is formed on the second interlayer insulating layer 25 by the CVD process or the like as a fluorine-doped oxide film having a thickness of 0.4 µm so as to cover the insulating film 15 and the second electrode 17. In this manner, the nonvolatile memory element 30 is formed and the diode 18 is formed on the resistance variable element 14. In this case, the first area 22 which determines a current drivability of the rectifying element 18 is 0.0079 m² which is larger than 0.0050 µm² of the second area 23. Since the third area 24 is made smaller than the second area 23, it is possible to suppress the crosstalk or the like by isolating the adjacent memory cells from each other when the nonvolatile memory element 30 is used as the memory cell for the cross-point type nonvolatile memory element.

Through the above described process flow, the nonvolatile memory element 30 is manufactured. The manufacturing process shown in this embodiment uses a mask process which is the same as a semiconductor planar process adapted for miniaturization such as a CMOS process. A special semiconductor process unique to the resistance variable layer 11 is not used to manufacture the resistance variable element 14. Therefore, the nonvolatile memory element 30 has high compatibility with a semiconductor process which is being adapted for further miniaturization, and the resistance variable layer 11 having a minimum size of a process rule in a process to be used can be manufactured.

It was confirmed that when in the nonvolatile memory element 30 manufactured as described above, Pt (thickness 50 nm) was used as the material for the upper electrode, Pt (thickness 50 nm) was used as the material for the lower electrode, and $Fe_3O_4$ (film thickness 100 nm) was used as the resistance variable layer, and electric pulses having different polarities (±4.3V) were applied alternately between the second electrode 17 and the lower electrode 12, a high-resistance value of 11KΩ and a low-resistance value of 2.5KΩ were alternately shown. Regarding the operation, it was confirmed that the above high-resistance value and low-resistance value were obtained alternately stably 1000 times or more in succession at a high-speed, when the electric pulses having different polarities are applied alternately with the pulse width being 100 nsec and the voltage being ±4.3V. A voltage of 3.3V is applied between the upper and lower electrodes (12, 13) of the resistance variable element 14 and a voltage of 1V is applied between the upper and lower electrodes (16, 17) of the diode 18. Therefore, when operating the memory element with the diode 18 connected in series with the resistance variable element 14 as illustrated in this embodiment, a voltage of 4.3 is applied between the upper electrode (second electrode) 17 of the diode 18 and the lower electrode 12 of the resistance variable element 14.

The above described manufacturing method of the nonvolatile memory element 30 may be applied to the cross-point type nonvolatile memory element array 40 shown in FIGS. 2 and 3 in the same manner for manufacturing the same. To be specific, in the cross-point type nonvolatile memory element array 40, the structure of the resistance variable element 14 is formed by a step for forming the stripe-shaped lower electrodes 12 on the substrate 10, a resistance film forming step for forming the resistance variable layers 11 on the lower electrodes 12, and an upper electrode forming step for forming the stripe-shaped upper electrodes 13 on the resistance variable layers 11. The manufacturing method includes a step for forming the insulating layer or semiconductor layer 15 on the resistance variable element 14, and a second electrode forming step for forming the second electrode 17 on the insulating layer or semiconductor layer 15. The resistance film forming step includes a step for forming the first interlayer insulating layer 19 covering the lower electrode 12, a hole forming step for forming the first contact hole 21 penetrating through the first interlayer insulating layer 19 on the lower electrode 12, and an embedding step for embedding the resistance variable layer 11 in the first contact hole 21. The lower electrode forming step forms the stripe-shaped lower electrodes 12 and the upper electrode forming step or the second electrode forming step forms the stripe-shaped upper electrodes 13 or the stripe-shaped second electrode 17 in a direction crossing the stripe-shaped lower electrodes 12.

Further, the first area 22 where the insulating layer or semiconductor layer 15 is in contact with the upper electrode 13 is made larger than the second area 23 where the resistance variable layer 11 is in contact with the upper electrode 13.

With this manufacturing method, the cross-point type nonvolatile memory element array 40 is attained, in which (8×8) memory cells each having the structure of the nonvolatile memory element 30 are arranged with a pitch of, for example, 0.22 μm in the directions perpendicular to each other as shown in FIG. 2. In the nonvolatile memory element array 40 of this embodiment, the stripe-shaped second electrodes 17 are formed to extend in the direction crossing the stripe-shaped lower electrodes 12. The process flow of the nonvolatile memory array 40 is attained in this embodiment by the process similar to that shown in FIGS. 4 and 5.

Whereas Al is used as the wire material in this embodiment, W, Pt, or Cu used in the semiconductor process may alternatively be used. Also, whereas Al is used as the electrode material, other electrode material such as Cu, Pt, TiN, TaN, or TiAlN may be used.

Whereas in this embodiment, the MIM diode having the MIM (metal-insulator metal) structure in which the SiN film is used as the insulating layer and the upper electrode and the lower electrode are made of Al is illustrated, a MSM diode having a MSM (metal-semiconductor-metal) structure in which the Si film is used as the semiconductor layer and the upper electrode and the lower electrode are made of Pt may alternatively be used.

In further alternative, a shottky diode in which the embedded electrode made of Pt and the semiconductor layer made of Si form a shottky junction and the opposite upper electrode made of Al is ohmic-joined to Si may be used. Moreover, other diode structure, for example, a PN-junction diode may be used.

Embodiment 2

Figure 6:
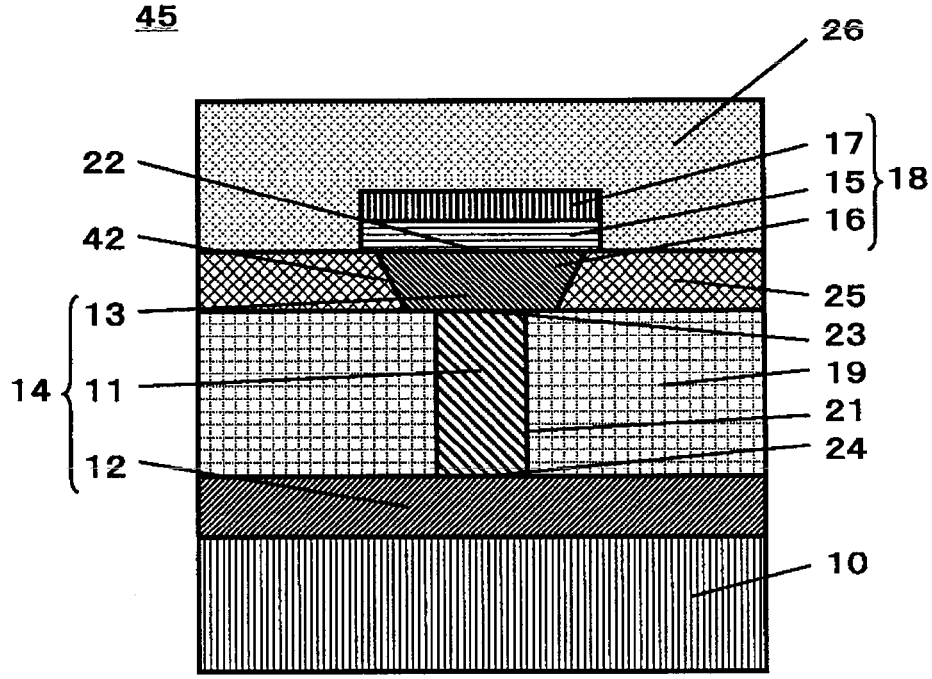
Figure 6:
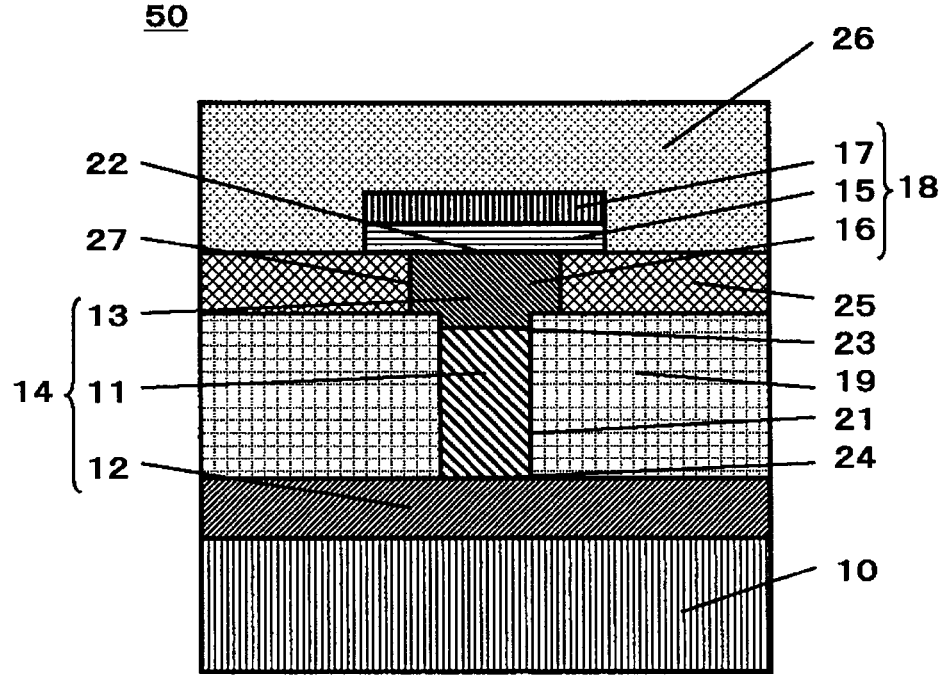

FIG. 6 is a view showing Embodiment 2 of the present invention. This embodiment is different from Embodiment 1 in that the cross-sectional shape of the upper electrode 13 of the resistance variable element 14 is devised for improving performance of the nonvolatile memory element. FIG. 6(*a*) shows a nonvolatile memory element 45 having a structure in which the upper electrode 13 of the resistance variable element 14 has a cross-section of a tapered shape (tapered shape having a size decreasing toward the resistance variable layer 11, i.e., shape in which a cross-section taken along a plane parallel to the main surface of the substrate 10 has a size gradually decreasing toward the substrate 10). FIG. 6(*b*) shows a nonvolatile memory element 50 having a structure in which a part of the cross-sectional of the upper electrode 13 is embedded in an upper portion of the first contact hole 21. A part of the upper electrode 13 of the nonvolatile memory element 50 is embedded in the first contact hole 21 along with the resistance variable layer 11. A part of the upper electrode is embedded in the second contact hole 27 penetrating through the second interlayer insulating layer 25. As shown in FIGS. 6(*a*) and 6(*b*), the first area 22 where the insulating layer or semiconductor layer 15 of the diode 18 is in contact with the first electrode 16 of the diode 18 is larger than the second area 23 where the resistance variable layer 11 is in contact with the upper electrode 13, as in Embodiment 1.

In the nonvolatile memory element 45 of FIG. 6(*a*), since the cross-section of the upper electrode 13 has the tapered shape, a large amount of current can be flowed from the diode 18 formed in a larger region than the resistance variable element 14 and having an increased current drivability, to the resistance variable element 14. As a result, electric performance of the nonvolatile memory element 45 is improved. In addition, since the region where the diode 18 is formed is effectively increased, i.e., an effective area thereof is increased, the resistance of the diode 18 is appropriately reduced so that a high-resistance state or a low-resistance state of the resistance variable element 14 can be accurately detected.

To manufacture the nonvolatile memory element 45, a second contact hole 42 having a truncated conical shape as shown in FIG. 6(*a*) is formed by an etching process such as RIE which is higher in chemical reactivity, instead of forming the cylindrical second contact hole 27 as shown in FIG. 5(*a*), after using the process flow shown in FIG. 4(*a*) to FIG. 4(*d*) described in Embodiment 1. By applying the process flow shown in FIG. 5 described in Embodiment 1 to form the upper electrode 13 in the second contact hole 42, the nonvolatile memory element 45 is attained.

In contrast, in the nonvolatile memory element 50 of FIG. 6(*b*), a part of the upper electrode 13 is embedded in the first contact hole 19 to improve a close contact state between the resistance variable layer 11 and the upper electrode 13 so that electric charges converge at the second area 23 and thereby a current is effectively applied to the resistance variable layer 11, thus improving performance. To manufacture the nonvolatile memory element 50, a part of the resistance variable layer 11 on an upper portion of the first contact hole 21 is removed by a CMP technique after using the process flow shown in FIGS. 4(*a*) to 4(*c*).

Polishing and flattening are performed by the CMP so as to expose the first interlayer insulating layer 19. Then, the resistance variable layer 11 is wet-etched using an etching liquid (e.g., dilute sulfuric acid) for etching only the resistance variable layer 11 to remove only a part of the upper portion of the resistance variable layer 11. Under the state, by performing the process flow of FIGS. 4(*d*) and 5(*a*) to 5(*d*), the nonvolatile memory element 50 can be manufactured.

With the above described configuration of this embodiment, a close contact state between the resistance variable layer 11 and the upper electrode 13 is improved, and as a result, a large amount of current can be flowed from the diode 18 with an increased current drivability, to the resistance variable element 14.

Embodiment 3

Figure 7:
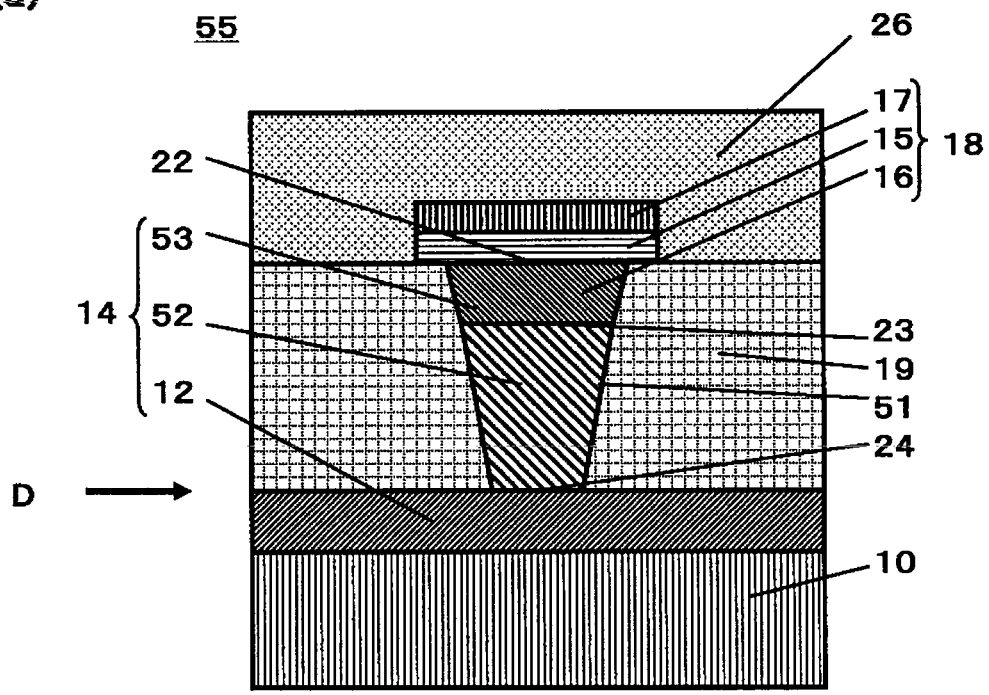
Figure 7:
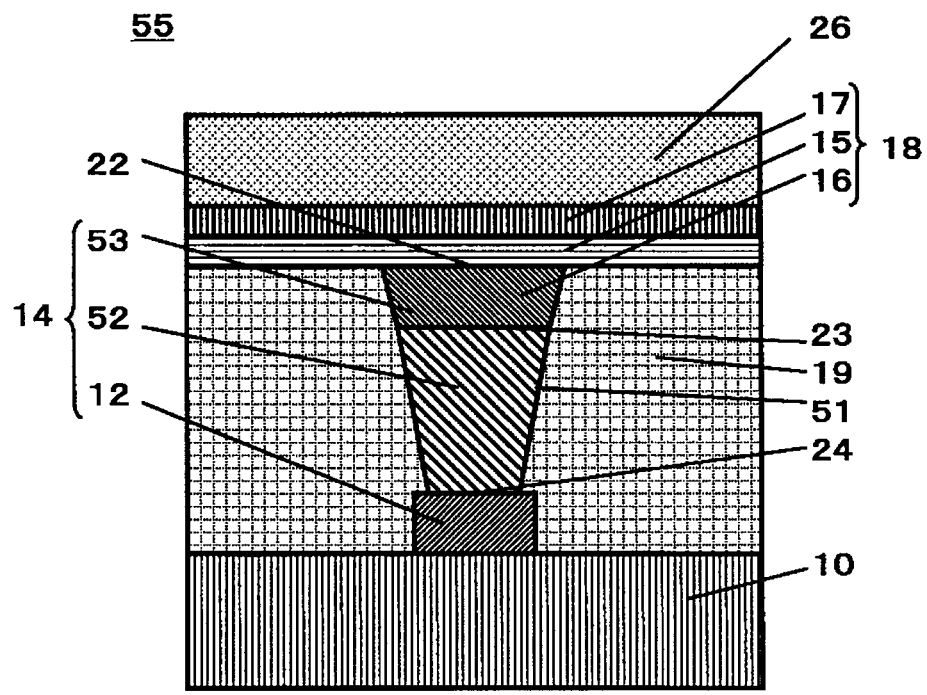

FIG. 7 is a view showing Embodiment 3 of the present invention. This embodiment is different from Embodiment 1 and Embodiment 2 in that a resistance variable layer 52 and an upper electrode 53 have cross-sections of a tapered shape (tapered shape having a size decreasing toward the lower electrode 12, i.e., shape in which a cross-section taken along the plane parallel to the main surface of the substrate 10 has a size gradually decreasing toward the substrate 10), and the resistance variable layer 52 and the upper electrode 53 are formed in the first contact hole 51 penetrating through the first insulating film 19. FIG. 7(b) is a schematic cross-sectional view of the nonvolatile memory element 55 as viewed from the direction of D in FIG. 7(a). In Embodiment 3, the first area 22 where the insulating layer or semiconductor layer 15 of the diode 18 is in contact with the first electrode 16 is made larger than the second area 23 where the resistance variable layer 52 is in contact with the upper electrode 53, as in Embodiment 1 and 2. In the structure of FIG. 7, the applied current from the diode 18 is gathered in the first area 22, converges at the second area 23 smaller than the first area 22, converges at the third area 24 smaller than the second area 23 through the resistance variable layer 52 and reaches the lower electrode 12. That is, by decreasing the size of the cross-section of the first contact hole 51 in the first interlayer insulating layer 19 in the tapered shape in a depth direction (tapered shape having a size decreasing toward the lower electrode 12, i.e., shape having a size gradually decreasing toward the substrate 10 as viewed from a thickness direction of the substrate 10), the cross-section of the resistance variable layer 51 embedded in the first contact hole 51 has a tapered shape having a size decreasing in the depth direction. Furthermore, since the second interlayer insulating layer shown in Embodiment 1 and Embodiment 2 are omitted by embedding the upper electrode 53 in the upper portion of the first contact hole 51 of the tapered shape, manufacturing steps can be further simplified.

The first contact hole 51 whose cross-section has a tapered shape having a size decreasing in the depth direction is formed by a manufacturing process such as RIE which is high in chemical reactivity when the first interlayer insulating layer 19 is etched as described in Embodiment 2. The step for embedding the resistance variable layer 52 and the upper electrode 53 in the first contact hole 51 of the tapered shape can be performed as follows.

The resistance variable layer 52 is embedded in the first contact hole 51 formed in the interlayer insulating layer 19 by etching, and thereafter the resistance variable layer on the upper portion of the first insulating film 19 is removed by using the CMP technique. Further, a part of the upper portion of the resistance variable layer 52 embedded in the first contact hole 51 is removed by the CMP technique, and then, the upper electrode 53 is embedded to a height of the first interlayer insulating layer 19, and the upper electrode material on the first interlayer insulating layer 19 is removed and flattened by the CMP technique. In this manner, the resistance variable layer 52 is embedded in the first contact hole 51 and the upper electrode 53 is embedded to a depth on the upper portion of the resistance variable layer 52.

As the manufacturing process other than the step for forming the first contact hole 51 of the tapered shape in the interlayer insulating layer 19 which is a single layer and the step for embedding the resistance variable layer 52 and the upper electrode 53 in the first contact hole 51 as described above, the process shown in FIGS. 4 and 5 described in the above described Embodiment 2 is applicable in the same manner.

In the above described configuration of this embodiment, crosstalk is prevented more surely by increasing the distance between adjacent lower electrodes 12. This is evident from comparison with the configuration of FIG. 3(b). Since the resistance variable layer 52 is caused to have a tapered shape having a size decreasing in the depth direction, the applied current converges efficiently to increase a current density. As a result, resistance switching in the resistance variable element 14 is attainable more surely.

Embodiment 4

Figure 8:
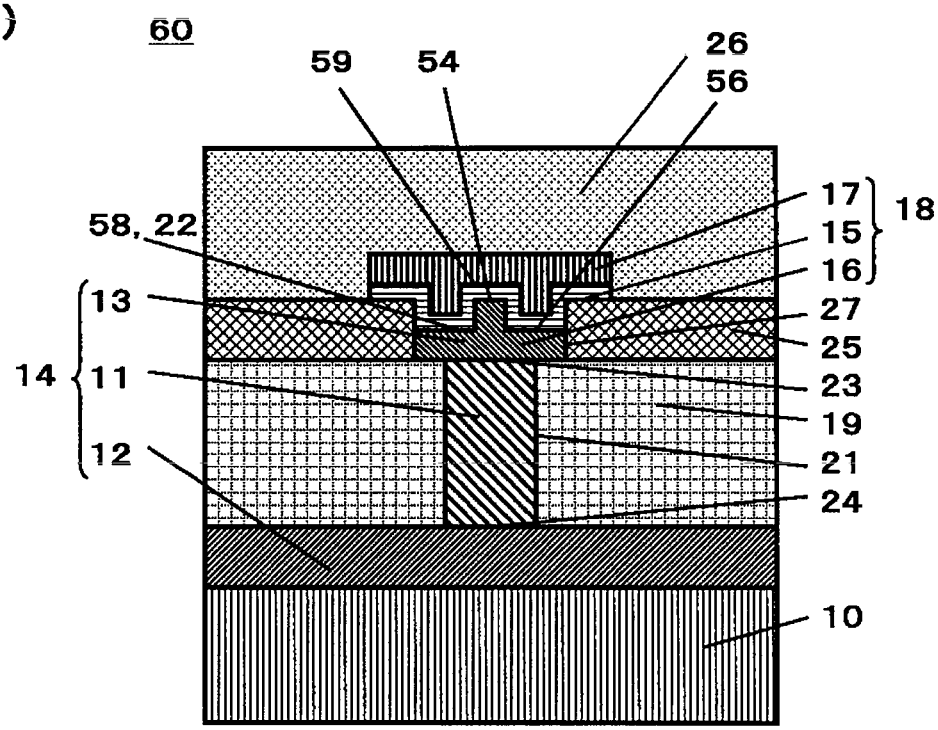
Figure 8:
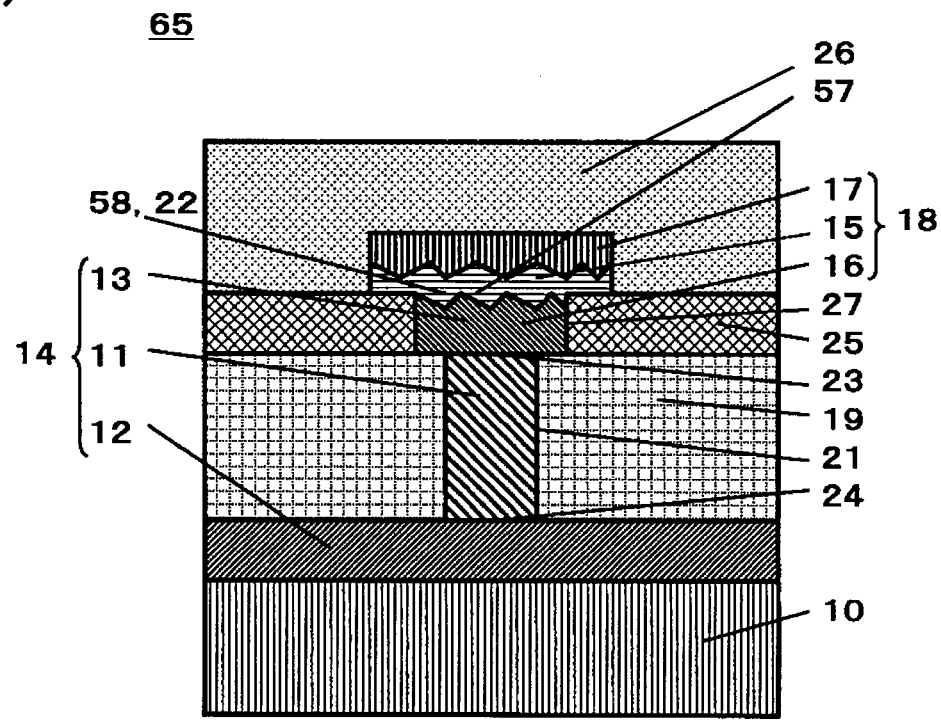

FIG. 8 is a view showing Embodiment 4 of the present invention. This embodiment is a modification of the nonvolatile memory element 30 of FIG. 1(b) described in Embodiment 1. That is, in nonvolatile memory elements 60 and 65 shown in FIGS. 8(a) and 8(b), the resistance variable element 14 has a structure basically similar to that of FIG. 1(b), but as shown in FIG. 8(a), a convex portion 54 and a flat portion (concave portion) 56 forming a step form is formed on an upper portion of the upper electrode 13 of the resistance variable element 14 (i.e., the convex portion 54 is formed at a center of the upper portion of the upper electrode 13), while as shown in FIG. 8(b), the upper surface of the upper electrode 13 is roughened by, for example, etching or the like to form a concave-convex surface 57. That is, a first contact surface 58 where the insulating layer or semiconductor layer 15 is in contact with the first electrode 16 or the upper electrode 13 is the concave surface, the convex surface, or the concave-convex surface.

In the nonvolatile memory element 60 of FIG. 8(a), the center portion of the upper electrode 13 of the resistance variable element 14 is left as the cylindrical convex portion 54 and a surrounding region of the convex portion 54 is etched in a ring shape. On the upper electrode 13 having such a shape, for example, the insulating layer 15 is laminated to conform to the concave-convex shape of the upper portion of the upper electrode 13, and the second electrode 17 is deposited to fill the concave portion on the insulating layer 15. Thereafter, the second electrode 17 is flattened using the CMP and the region other than the region in the vicinity of the upper portion of the resistance variable layer 11 is etched so as to leave only the region in the vicinity of the upper portion. In this case, the first area 22 where the insulating layer 15 is in contact with the first electrode 16 is formed by the concave-convex surface, and therefore, is made larger than the second area 23 where the resistance variable layer 11 is in contact with the upper electrode 13. The nonvolatile memory element 60 of this modification can be manufactured by applying the process of FIGS. 4 and 5 described in Embodiment 2 in the same manner, as the other manufacturing process.

With the above described configuration, the nonvolatile memory element 60 is capable of improving a close contact state between the upper portion of the upper electrode 13 and the lower portion of the insulating layer 15, and of flowing a large amount of current from the diode 18 with an increased current drivability, to the resistance variable element 14, through the first contact surface 22. This enables the applied current to converge efficiently to increase the current density, so that resistance switching in the resistance variable element 14 is attained more surely. In addition, as shown in FIG. 8(a), since the surface where the second electrode 17 of the diode 18 is in contact with the insulating layer 15 of the diode 18 is formed as a concave-convex surface 59, the current drivability of the diode 18 can be further improved.

In the nonvolatile memory element 65 of FIG. 8(b), the concave-convex surface 57 is formed on the upper surface of the upper electrode 13 of the resistance variable element 14. On the concave-convex surface 57, for example, an insulating layer 15 is deposited. The insulating film 15 formed by the deposition has a concave-convex surface similar to the upper surface of the upper electrode 13. The second electrode 17 is deposited to conform to the concave-convex surface of the insulating film 15 and thereafter is flattened using the CMP, and the region other than the region in the vicinity of the upper portion of the resistance variable layer 11 is etched so as to leave the region in the vicinity of the upper portion. In this case, the first area 22 where the insulating layer 15 is in contact with the first electrode 16 is formed by the concave-convex surface and therefore, is made larger than the second area 23 where the resistance variable layer 11 is in contact with the upper electrode 13. The nonvolatile memory element 60 of this modification can be manufactured by applying the process of FIGS. 4 and 5 described in Embodiment 2 in the same manner, as the other manufacturing process.

With the above described configuration, the nonvolatile memory element 65 is capable of improving a close contact state between the upper portion of the upper electrode 13 and the lower portion of the insulating layer 15, and of flowing a large amount of current from the diode 18 with an increased current drivability, to the resistance variable element 14, through the first contact surface 22. This enables the applied current to converge efficiently to increase the current density, so that resistance switching in the resistance variable element 14 is attained more surely. In addition, as shown in FIG. 8(b), if the surface where the second electrode 17 of the diode 18 is in contact with the insulating layer 15 is the concave-convex surface 59, the current drivability of the diode 18 can be further improved.

Embodiment 5

Figure 9:
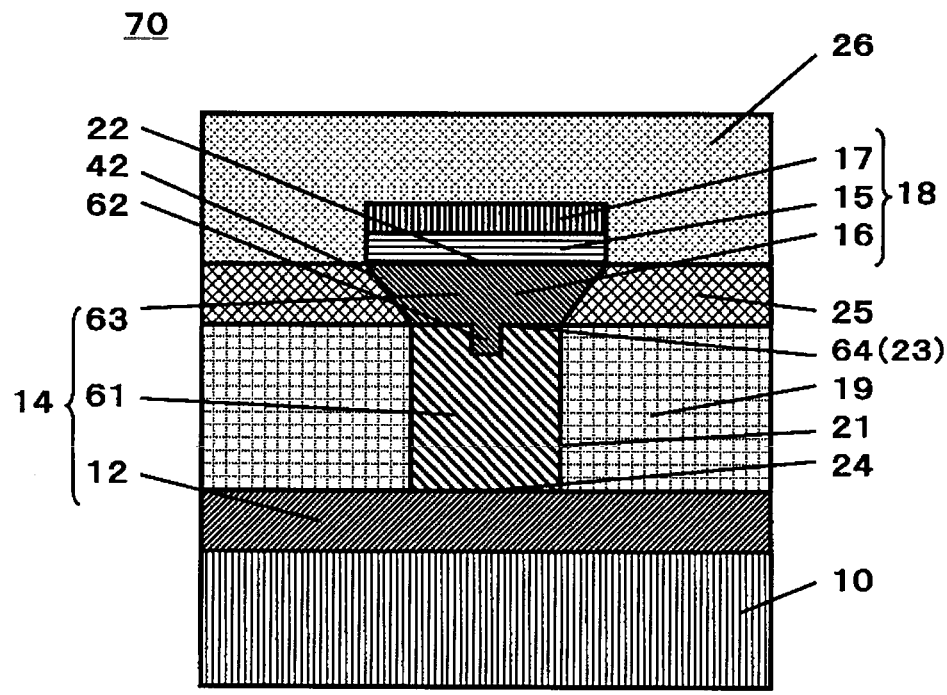
Figure 9:
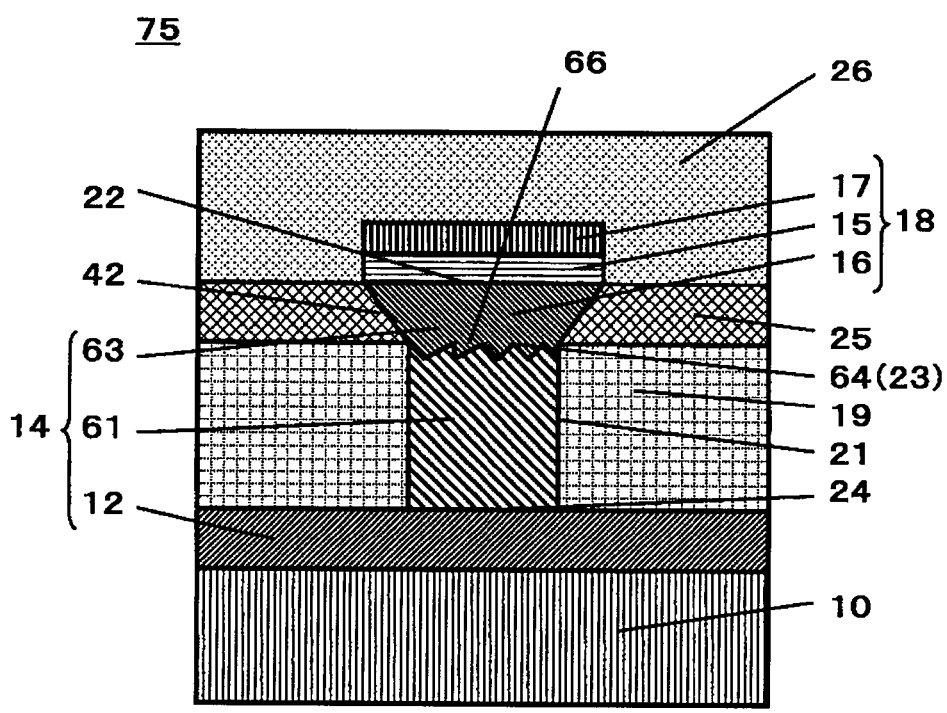

FIG. 9 is a view showing Embodiment 5 of the present invention. This embodiment is a modification of the nonvolatile memory element 45 of FIG. 6(a) described in Embodiment 2. To be specific, in nonvolatile memory elements 70 and 75 shown in FIGS. 9(a) and 9(b), a second contact surface 64 where the resistance variable layer 61 is in contact with the upper electrode 63 is a concave surface, a convex surface or a concave-convex surface. In this case, the second contact surface 64 of the upper portion of the resistance variable layer 61 formed in the cylindrical first contact hole 21 is a cylindrical concave surface at the center of the resistance variable layer 61 as shown in FIG. 9(a), while the second contact surface 64 is a concave-convex surface which is formed by roughening the upper surface of the resistance variable layer 61 by the etching or the like as shown in FIG. 9(b), so that the second area 23 which is the area of the second contact surface 64 is larger than the third area 24 of the lower portion of the resistance variable layer 61. In the configurations shown in FIGS. 9(a) and 9(b), the first area 22 is made larger than the second area 23 as in the above described embodiments.

In the nonvolatile memory element 70 of FIG. 9(a), a cylindrical concave portion 62 is formed on the upper portion of the resistance variable layer 61 on the lower electrode 12, and the convex-shaped upper electrode 63 is fitted into the concave portion 62. By forming the concave portion on the upper portion of the resistance variable layer 61 in the cylindrical first contact hole 21 which is easier to form, the second area 64 can be made larger than the third area 24. In such a configuration, the nonvolatile memory element 70 is capable of improving a close contact state between the upper portion of the resistance variable layer 61 and the lower portion of the upper electrode 63, and of flowing a large amount of current from the diode 18 with an increased current drivability to the resistance variable element 14 through the second contact surface 64. This enables the applied current to converge efficiently to increase the current density. As a result, resistance switching of the resistance variable element 14 is attainable more surely. The formation of the concave portion 62 on the upper portion of the resistance variable layer 61 can be performed by etching using photolithography.

Likewise, in the nonvolatile memory element 75 of FIG. 9(b), a concave-convex surface 66 is formed on the upper portion of the resistance variable layer 61 on the lower electrode 12, and the upper electrode 63 having a concave-convex-shaped lower surface is fitted to conform to the concave-convex surface 66. By forming the concave-convex surface 66 on the upper portion of the resistance variable layer 61 in the cylindrical first contact hole 21 which is easier to form, the second area 64 can be made larger than the third area 24. In such a configuration, the nonvolatile memory element 75 is capable of improving a close contact state between the upper portion of the resistance variable layer 61 and the lower portion of the upper electrode 13, and of flowing a large amount of current from the diode 18 with an increased current drivability to the resistance variable element 14 through the second contact surface 64. This enables the applied current to converge efficiently to increase the current density. As a result, resistance switching of the resistance variable element 14 is attainable more surely. The formation of the concave-convex surface 66 on the upper portion of the resistance variable layer 61 can be performed by etching using photolithography at a high etching speed.

Embodiment 6

Figure 10:
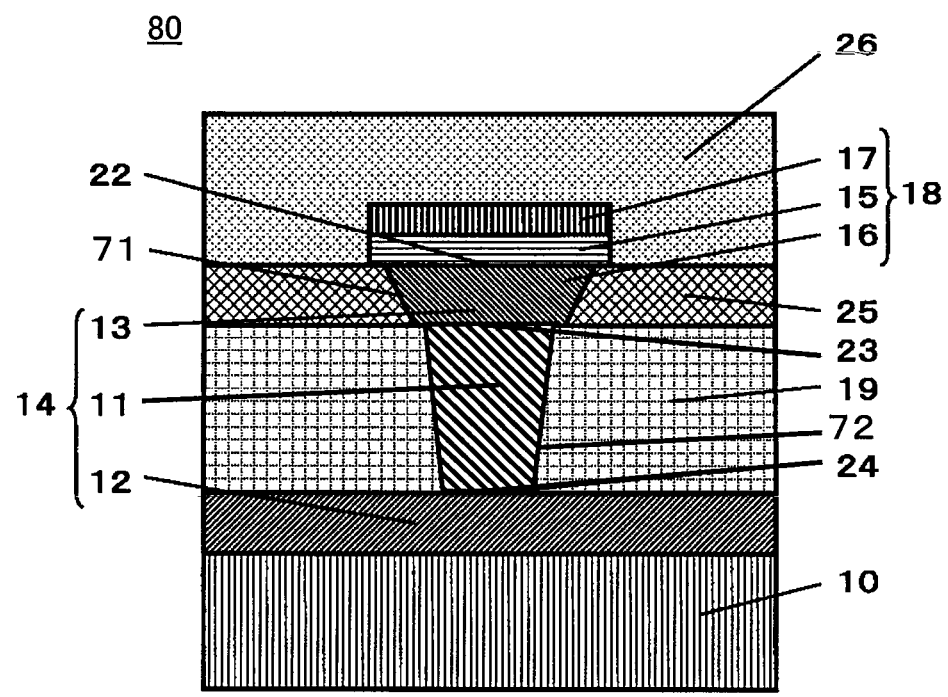
FIG. 10 is a schematic cross-sectional view of a nonvolatile memory element according to Embodiment 6 of the present invention.

FIG. 10 is a view showing Embodiment 6 of the present invention. This embodiment is a modification of the nonvolatile memory element 45 of FIG. 6(a) described in Embodiment 2. To be specific, in a nonvolatile memory element 80 shown in FIG. 10, the resistance variable layer 11 has a cross-section of a tapered shape (tapered shape having a size decreasing toward the lower electrode 12, i.e., shape in which a cross-section taken along a plane parallel to the main surface of the substrate 10 has a size gradually decreasing toward the substrate 10). In addition, the upper electrode 13 (first electrode 16) has a cross-section of a tapered shape (tapered shape having a size decreasing toward the resistance variable layer 11, i.e., shape in which a cross-section taken along a plane parallel to the main surface of the substrate 10 has a size gradually decreasing toward the substrate 10).

The shape of the resistance variable layer 11 is obtained by gradually decreasing the size of the shape of the first contact hole 72 penetrating through the first interlayer insulating layer 19 toward the substrate 10 as viewed from the thickness direction of the substrate 10.

The shape of the upper electrode 13 (first electrode 16) is obtained by gradually decreasing the size of the shape of the second contact hole 71 penetrating through the second interlayer insulating layer 25 toward the substrate 10 as viewed from the thickness direction of the substrate 10.

In manufacture of the nonvolatile memory element 80, the first contact hole 72 having a truncated conical shape of FIG. 10 is formed by the etching process such as RIE which is higher in chemical reactivity, in the process flow in FIGS. 4(a) to 4(d) described in Embodiment 1. Thereafter, the second contact hole 71 having a truncated conical shape shown in FIG. 10 can be formed by an etching process such as RIE which is higher in chemical reactivity, instead of forming the cylindrical second contact hole as shown in FIG. 5(a). By forming the upper electrode 13 (first electrode 16) in the second contact hole 71 by applying the process flow shown in FIG. 5 described in Embodiment 1, the nonvolatile memory element 80 is attained.

In this embodiment, the first contact hole 72 and the second contact hole 71 are formed by separate processes. To enable the lower end surface of the upper electrode 13 (first electrode 16) to surely cover the resistance variable layer 11, the area of the lower end surface is larger than the area (second area) of the upper end surface of the resistance variable layer 11. Further, since the insulating layer or semiconductor layer 15 is formed to cover the upper electrode 13 (first electrode 16), the first area 22 is equal to the area of the upper end surface of the upper electrode 13 (first electrode 16).

In the above described configuration, since the first contact hole 72 and the second contact hole 71 are formed to have a size gradually decreasing toward the substrate 10 as viewed from the thickness direction of the substrate 10, the resistance variable layer 11 and the upper electrodes 13 (first electrode 16) which are embedded in these contact holes are inevitably formed to have a tapered shape. Thereby, the first area 22 is inevitably larger than the second area 23 and the second area 23 is inevitably larger than the third area 24. Therefore, the first area 22 is inevitably larger than the third area 24. That is, in this embodiment, by forming the contact holes such that they have a size gradually decreasing toward the substrate 10 as viewed from the thickness direction of the substrate 10, the relationship in size between the areas of the interfaces of the electrodes is easily adjustable.

Embodiment 7

Figure 11:
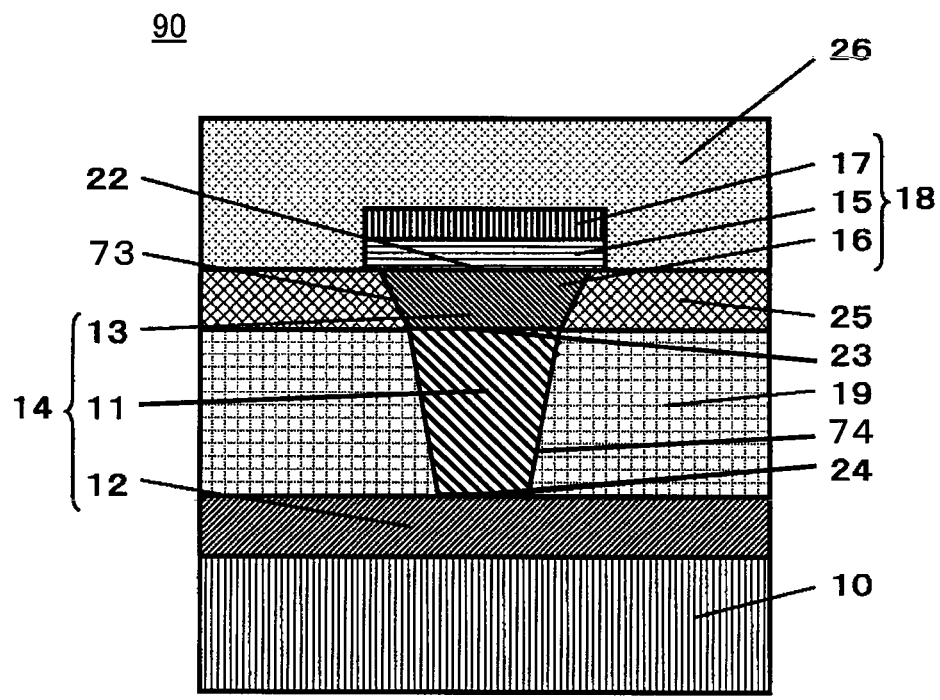
FIG. 11 is a schematic cross-sectional view of a nonvolatile memory element according to Embodiment 7 of the present invention.

FIG. 11 is a view showing Embodiment 7 of the present invention. This embodiment is a modification of the nonvolatile memory element 45 of FIG. 6(a) described in Embodiment 2. To be specific, in a nonvolatile memory element 90 shown in FIG. 11, the resistance variable layer 11 has a cross-section of a tapered shape (tapered shape having a size decreasing toward the lower electrode 12, i.e., shape in which a cross-section taken along a plane parallel to the main surface of the substrate 10 has a size gradually decreasing toward the substrate 10). In addition, the upper electrode 13 (first electrode 16) has a cross-section of a tapered shape (tapered shape having a size decreasing toward the resistance variable layer 11, i.e., shape in which a cross-section taken along the plane parallel to the main surface of the substrate 10 has a size gradually decreasing toward the substrate 10). This embodiment is different from Embodiment 6 in that the area of the lower end surface of the upper electrode 13 (first electrode 16) is equal to the area of the upper end surface of the resistance variable layer 11.

The shape of the resistance variable layer 11 is obtained by gradually decreasing the size of the first contact hole 74 penetrating through the first interlayer insulating layer 19 toward the substrate 10 as viewed from the thickness direction of the substrate 10.

The shape of the upper electrode 13 (first electrode 16) is obtained by gradually decreasing the size of the second contact hole 73 penetrating through the second interlayer insulating layer 25 toward the substrate 10 as viewed from the thickness direction of the substrate 10.

In manufacture of the nonvolatile memory element 90, the first interlayer insulating layer 19 and the second interlayer insulating layer 25 are laminated in this order on the substrate 10, and thereafter, the first contact hole 74 and the second contact hole 73 having a truncated conical shape shown in FIG. 10 are formed at a time, using the etching process such as RIE which is high in chemical reactivity. By forming the second interlayer insulating layer 25 of a material which recedes more easily than that of the first interlayer insulating layer 19, the tilted surface of the second contact hole 73 is gentler than that of the first contact hole 74. As a material for the interlayer insulating layer, for example, $SiO_2$ is used for the first interlayer insulating layer 19 and SiN is used for the second interlayer insulating layer 25.

By forming the resistance variable layer 11 in the first contact hole 74 by applying the process flow shown in FIG. 4 described in Embodiment 1 and then by forming the upper electrode 13 (first electrode 16) in the second contact hole 73 by applying the process flow shown in FIG. 5 described in Embodiment 1, the nonvolatile memory element 90 is attainable.

Since in this embodiment, the first contact hole 74 and the second contact hole 73 are formed in the identical process, the area of the lower end surface of the upper electrode 13 (first electrode 16) is equal to the area of the upper end surface of the resistance variable layer 11. Since the insulating layer or semiconductor layer 15 is formed to cover the upper electrode 13 (first electrode 16), the first area 22 is equal to the area of the upper end surface of the upper electrode 13 (first electrode 16).

In the above described configuration, since the first contact hole 74 and the second contact hole 73 are formed to have a size gradually decreasing toward the substrate 10 as viewed from the thickness direction of the substrate 10, the resistance variable layer 11 and the upper electrode 13 (first electrode 16) are inevitably formed to have a tapered shape. Therefore, the first area 22 is inevitably larger than the second area 23, the second area 23 is inevitably larger than the third area 24, and the first area 22 is inevitably larger than the third area 24. That is, in this embodiment, by forming the contact holes such that they have a size decreasing toward the substrate 10 as viewed from the thickness direction of the substrate 10, the relationship in size between the areas of the interfaces of the electrodes is easily adjustable.

It was confirmed that, when $Fe_3O_4$ was used as the resistance variable layer and electric pulses (±4.3V) having different polarities are applied alternately between the second electrode 17 and the lower electrode 12 in the nonvolatile memory elements 45, 50, 55, 60, 65, 70, and 75 manufactured in Embodiment 2 to Embodiment 5, a high-resistance value of 11KΩ and a low-resistance value of 2.5KΩ repeated alternately. Regarding the operation, it was confirmed that when the electric pulses are applied with a pulse width being 100 nsec and a voltage being set to +3.3V and −3.3V such that the electric pulses of different polarities are applied alternately, the high-resistance value and the low-resistance value are obtained alternately stably at a high speed 1000 times or more in succession. A voltage of 3.3V is applied between the upper and lower electrodes (12, 63) of the resistance variable element 14 and a voltage of 1V is applied between the upper and lower electrodes (16, 17) of the diode 18. Therefore, when operating the memory element of this embodiment in which the diode 18 is connected in series with the resistance variable element 14, a voltage of 4.3V is applied between the upper electrode (second electrode) 17 of the diode 18 and the lower electrode 12 of the resistance variable element 14.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention provides a large-capacity nonvolatile memory element which achieves high-density integration and stable operation, and a manufacturing method thereof, and is useful in achieving small-size and thinness in electronic hardware such as portable information devices or information home appliances.

The invention claimed is:

1. A nonvolatile memory element array comprising a plurality of nonvolatile memory elements each of which comprises:

a substrate;

an interlayer insulating layer provided on the substrate;

a resistance variable element having a lower electrode covered with the interlayer insulating layer, an upper electrode provided to be located farther from the substrate than the lower electrode, and a resistance variable layer interposed between the upper electrode and the lower electrode; and a diode having a first electrode which is provided to be located farther from the substrate than the upper electrode and is connected in series with the upper electrode, a second electrode which is provided to be located farther from the substrate than the first electrode, and an insulating layer or semiconductor layer which is interposed between the first electrode and the second electrode;

wherein the resistance variable element has a characteristic in which a resistance value of the resistance variable element becomes a high-resistance value and a low-resistance value which is lower than the high-resistance value alternately, when electric pulses having different polarities are applied between the lower electrode and the upper electrode alternately;

wherein the first electrode, the insulating layer or semiconductor layer, and the second electrode form a MIM diode or a MSM diode;

wherein the interlayer insulating layer is provided with a contact hole penetrating through the interlayer insulating layer in a direction substantially perpendicular to a main surface of the substrate and reaching the lower electrode:

wherein the resistance variable layer is embedded in the contact hole;

wherein when an area of a portion where the insulating layer or semiconductor layer is in contact with the first electrode is a first area and an area of a portion where the resistance variable layer is in contact with the upper electrode is a second area, the first area is larger than the second area; and wherein a contour of the resistance variable layer is inward relative to a contour of the upper electrode when viewed from the direction perpendicular to the main surface of the substrate, wherein a plurality of lower electrodes are arranged to extend in parallel with each other within a first plane parallel to the main surface of the substrate;

wherein a plurality of second electrodes are arranged to extend in parallel with each other within a second plane parallel to the first plane and to three-dimensionally cross the plurality of lower electrodes;

wherein resistance variable layers are provided between the plurality of lower electrodes and the plurality of second electrodes to respectively correspond to three-dimensional cross points between the lower electrodes and the second electrodes to form the plurality of nonvolatile memory elements which are provided to respectively correspond to the three-dimensional cross points; and wherein the resistance variable layers are provided on a common lower electrode such that the resistance variable layers are physically in contact with the common lower electrode and are spaced apart from each other via the interlayer insulating layer.

* * * * *